United States Patent [19]

Takemoto et al.

[11] Patent Number: 5,003,539
[45] Date of Patent: Mar. 26, 1991

[54] APPARATUS AND METHOD FOR ENCODING AND DECODING ATTRIBUTE DATA INTO ERROR CHECKING SYMBOLS OF MAIN DATA

[75] Inventors: Sohei Takemoto, Fremont; Leonard A. Pasdera, San Carlos, both of Calif.

[73] Assignee: Ampex Corporation, Redwood City, Calif.

[21] Appl. No.: 455,858

[22] Filed: Dec. 15, 1989

Related U.S. Application Data

[63] Continuation of Ser. No. 144,342, Dec. 11, 1987, abandoned, which is a continuation-in-part of Ser. No. 851,025, Apr. 11, 1986, abandoned.

[51] Int. Cl.$^5$ ............................................. G06F 11/10
[52] U.S. Cl. .............................................................. 371/37.
[58] Field of Search ................... 371/37.1, 37.4, 37.7, 371/37.2, 38.1, 39.1, 40.1, 41

[56] References Cited

U.S. PATENT DOCUMENTS

| | | | |
|---|---|---|---|
| 4,642,808 | 2/1987 | Baggen | 371/39 |
| 4,646,301 | 2/1987 | Okamoto | 371/37 |
| 4,648,091 | 3/1987 | Gajjar | 371/37 |
| 4,649,540 | 3/1987 | Proebstring | 371/37 |
| 4,653,051 | 3/1987 | Sugimura | 371/37 |
| 4,653,052 | 3/1987 | Doi | 371/39 |

*Primary Examiner*—Jerry Smith
*Assistant Examiner*—Robert W. Beausoliel
*Attorney, Agent, or Firm*—Ralph L. Mossino; Elizabeth E. Strnad

[57] ABSTRACT

Apparatus and methods for encoding information of one class into the parity for main data of another class. One such method and apparatus fundamentally takes one member $A_x$ of a limited first class of data called attribute data and concatenates it with main data. Parity is then calculated on the concatenate word. After the main data and parity is transmitted or recorded, the selected member of the first class of data may be recovered by comparing the received parity to the parity P" generated on the receiver side using the main data and each member of the first class of data to generate a plurality of syndromes. The first all zero syndrome identifies the member of the first class which was encoded into the parity of the main data. Another method and apparatus are similar except that the transmitter side calculates parity $P_{ax}$ for the selected member of the first class and then encodes that parity into the parity calculated for the main data. On the receiver side, parity bits are calculated for each member of the first class and then combined with parity $P_d'$ calculated on the main data to generate parity P". This parity P" is then compared to the received parity P', and the first match indicates which member of the first class was encoded on the transmitter side.

21 Claims, 15 Drawing Sheets

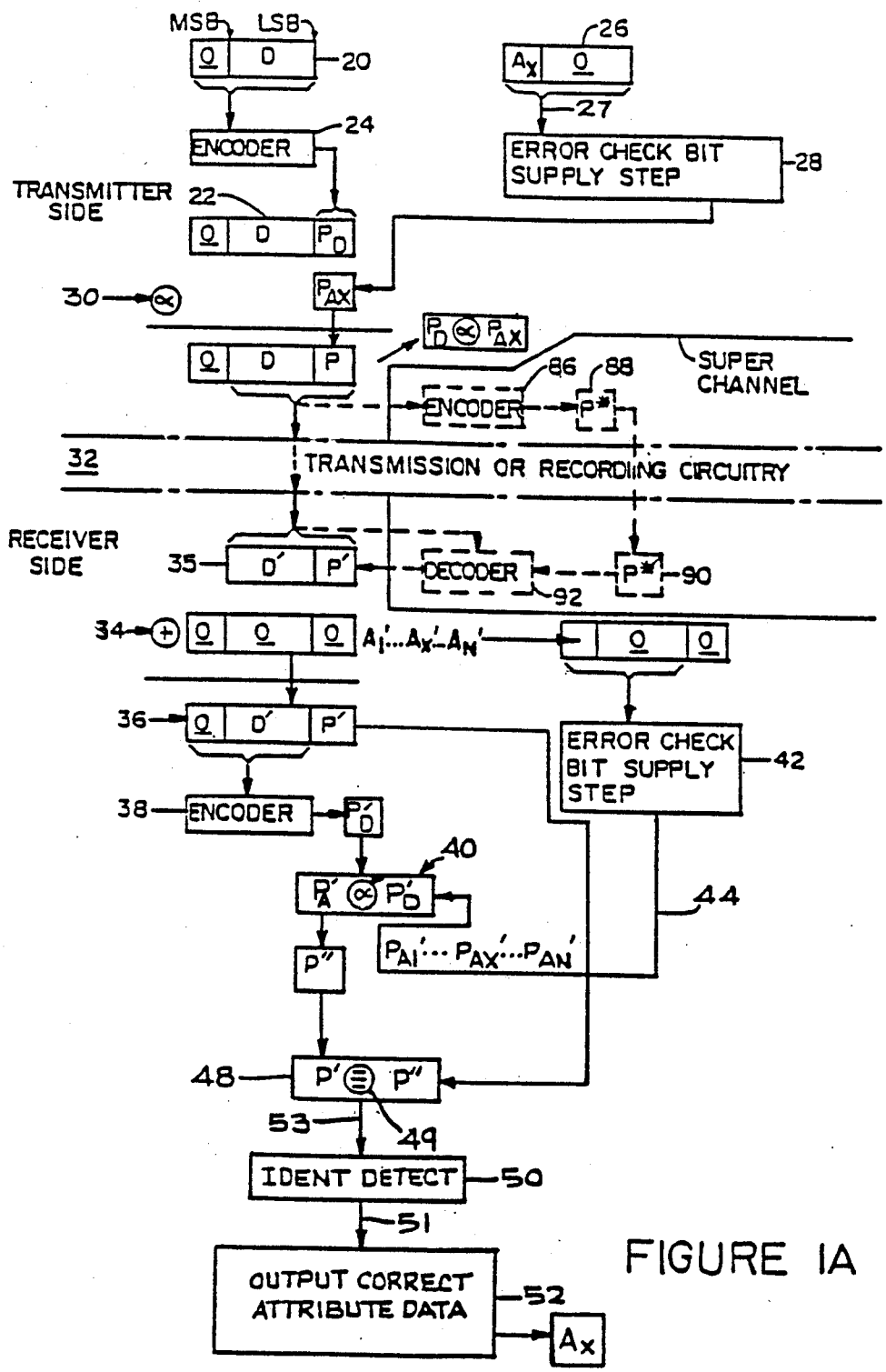
FIGURE IA

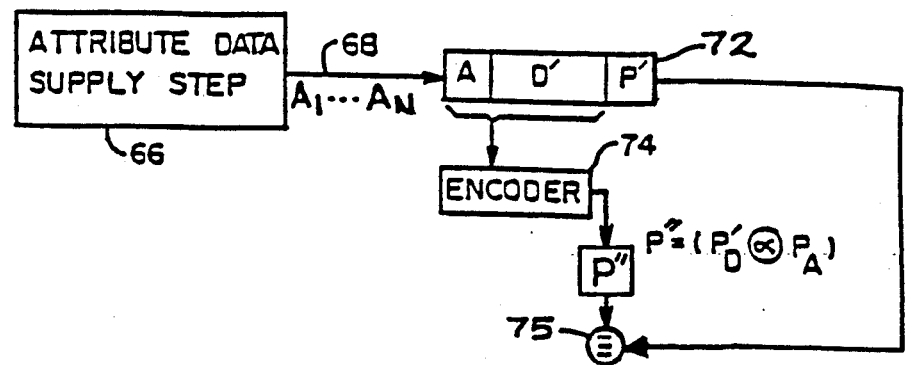
FIGURE 2B
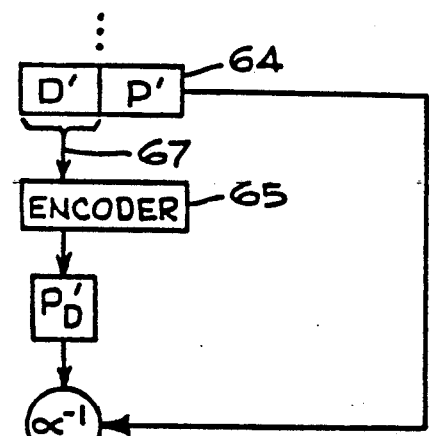
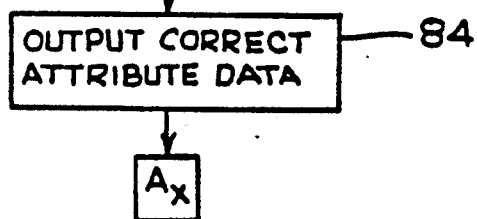
FIGURE 2C

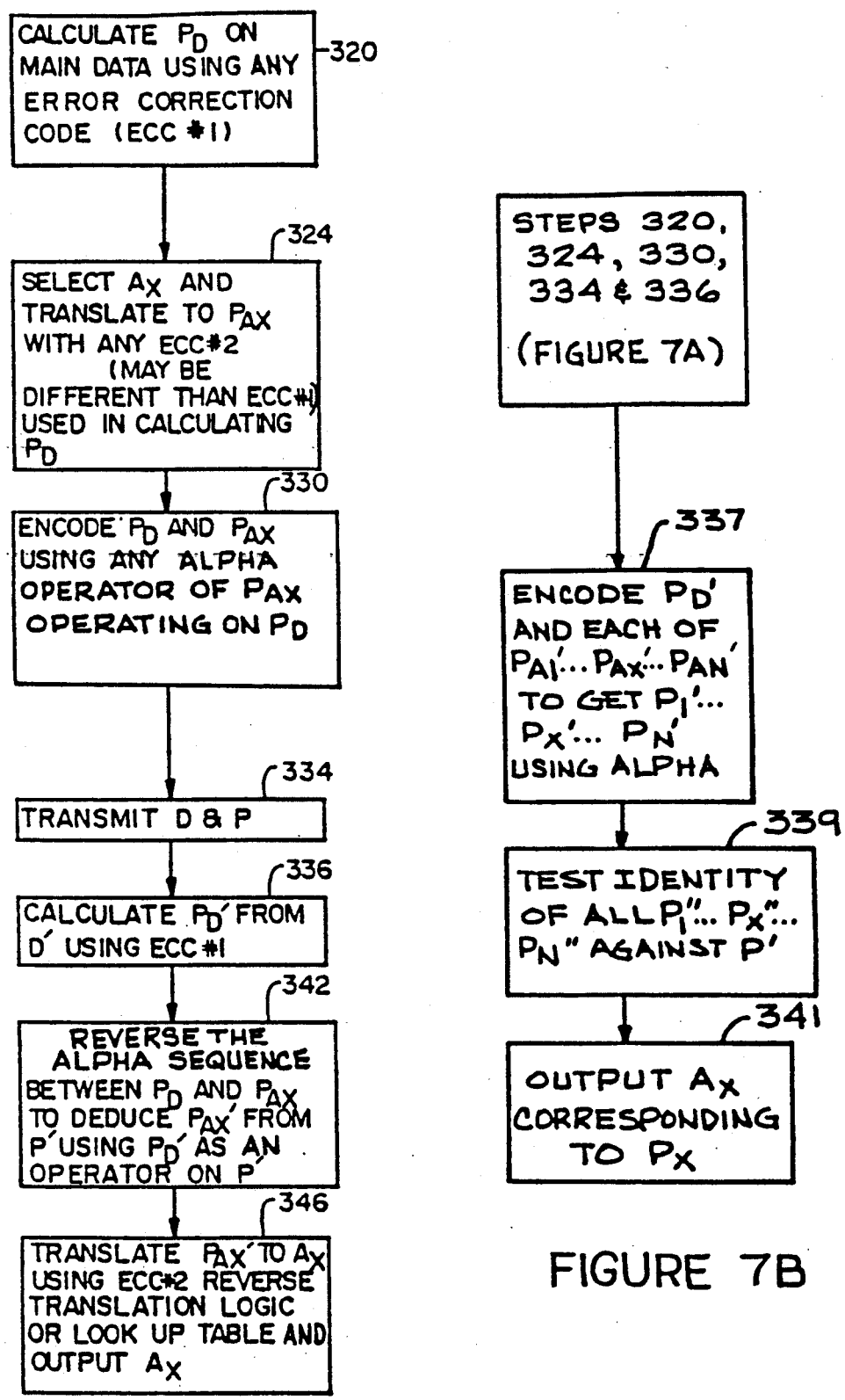

5,003,539

APPARATUS AND METHOD FOR ENCODING AND DECODING ATTRIBUTE DATA INTO ERROR CHECKING SYMBOLS OF MAIN DATA

This is a continuation of U.S. application Ser. No. 144,342, filed Dec. 11, 1987, now abandoned, which is based upon and is entitled to the benefit of the effective filing date of International Patent Cooperation Treaty application Number PCT/US87/00829, filed Apr. 9, 1987, and which is continuation-in-part of the U.S. application Ser. No. 851,025, filed Apr. 11, 1986, now abandoned.

BACKGROUND OF THE INVENTION

The invention relates to the field of transmission of digital data. More specifically, the invention relates to the encoding of attribute data into the parity or error check symbols for main data, i.e., the addition of additional data symbols to the data symbols of the digital data being transmitted which are the error check symbols encoded with the information of the attribute data to be conveyed, and later recovery of said attribute data from the transmitted main data combined with its attribute encoded error check symbols.

In the field of transmission (this includes video tape recording which in the video arts is considered equivalent to transmission) of digital data, it is common to use error check symbols or parity symbols which are generated from the data being transmitted and which are used on the receiver side of the link to improve the reliability of the transmission process. These error check or parity symbols are usually digital bits when binary code is used, but may also be symbols having more than two values for codes other than binary. The error check or parity symbols will hereafter be referred to as error check symbols. They are generated in many different known ways. Generally, the generation of error check symbols involves the use of error correcting codes which translate the main data to be transmitted or recorded into one or more error check symbols. In linear error correcting codes, this is done by dividing the polynomial represented by the main data by an error check polynomial and using the remainder as the error check symbols. Many different error correction codes are known to do this translation process some of which are linear and some of which are not linear. Those skilled in the art appreciate the difference between linear and nonlinear codes.

After the error check symbols are generated, the main data and the error check symbols are combined and transmitted to the receiver. Hereafter, the main data to be transmitted without any error check symbols appended thereto will be referred to as the main data while the main data with the error check symbols appended thereto will be referred to as the transmitted data. The main data with the error check symbols appended thereto and encoded with the attribute data will be referred to hereafter as the attribute encoded transmitted data and the main data error check symbols encoded with the attribute data will be hereafter referred to as the modified error check symbols.

In the prior art at the receiver, the transmitted data is decoded to generate what is called a syndrome. If there were no errors in the transmission process, the syndrome will indicate this condition, usually by being all zeros in the binary code case. If there were errors, the syndrome will so indicate. Furthermore, if the error was within the range of error correction of the error check symbols, the location of the error will be indicated by the syndrome. The range of error correction is controlled by the number of error check symbols that are appended to the main data and is the number of errors which can occur and be corrected by use of the error check symbols although any number of errors can be detected but may not be correctable because they exceed the error correction range. Depending upon the number of symbols in error and the number of check symbols generated, the error check symbols may be decoded with the main data to allow correction of errors of less than a certain number of symbols and detection of some errors having a greater number of symbols in error. Generally, the use of a higher number of check symbols for a given number of main data symbols will increase the reliability of the error detection and error correction process.

In certain digital systems, a set of separate and dedicated data symbols are commonly used to identify certain attributes of the main data that is to be transmitted. Hereafter, this separate and dedicated data will be called "attribute data". As an example of what attribute data typically is, in color television signal transmission and processing systems of a digital nature, the attribute data can be the horizontal sync-to-color subcarrier burst phase for every TV scanning line. This phase relationship is not specified in the color television signal. It is a value that must be calculated based upon the detected relative times of occurrence of a certain time in the horizontal synchronization pulse and the beginning of the color subcarrier burst. In digital video applications, this phase relationship may be calculated on the transmitter side.

In the prior art, it has been common to separately encode such sync-to-color subcarrier burst phase for every TV scanning line into a few symbols of data. These attribute symbols are then added to the group of video sample data words that belong to this same horizontal scanning line. The data words defining the video (and usually the synchronization signals) for each horizontal scanning line plus its associated attribute data are then transmitted. Upon reception of the transmitted data, the sync-to-color subcarrier burst phase information identified by the attribute symbols is used to facilitate the processing of the accompanying video data.

The difficulty with this approach is that in transmitting the attribute data in addition to the main data, a certain portion of the bandwidth of the transmission channel must be devoted to the transmission of the attribute data, and, in the case of storage, certain physical space on magnetic media or like memory is required for the attribute data. Bandwidth in transmission channels and space in storage memories is usually at a premium, and it is advantageous to save bandwidth in transmission channels and space in storage memories in any possible manner.

Accordingly, a need has arisen for a technique of encoding attribute data in digital data which enables transmission and recovery of the attribute data without the addition of attribute data symbols to the transmitted data, i.e., without transmitting attribute data symbols in addition to the main data and the error check symbols.

SUMMARY OF THE INVENTION

For simplicity and ease of expression, certain terminology is hereafter used in identifying circuitry and data involved in the operation of embodiments of the invention. The invention is described in detail with reference to embodiments adapted for the transmission and reception of data, and therefore embodiments of the invention will hereafter be identified in terms of a transmitter side and a receiver side. The "transmitter side", in a first embodiment, should be understood as referring to circuitry which generates unencoded error check symbols from the main data to be transmitted, hereafter referred to as the "first main data error check symbols", and which generates error check symbols for a selected member of an attribute data class, hereafter called the "attribute error check symbols"(note that the "error check symbols" for the attribute data are not actually used to detect and correct errors in the attribute data but are merely used to identify the member of the attribute data class and further references to attribute error check symbols should be understood to mean attribute data identification symbols) and combines the two sets of error check symbols into what Will be hereafter referred to as "modified error check symbols" for actual transmission. In a second embodiment, the transmitter side circuitry should be understood as referring to the circuitry which concatenates the selected member of the attribute data class at the most significant bit position of the main data to form an input string to an error check bit generator and generates error check symbols from this input string. These error check symbols will also be referred to as "modified error check symbols".

The receiver side circuitry, in a first embodiment, should be understood as referring to the circuitry which: operates on the main data in the condition in which it is received, hereafter referred to as the "received main data", to generate new error check symbols therefrom which will be hereafter referred to as the "second main data error check symbols"; combines the second main data error check symbols with the received version of the modified error check symbols, hereafter referred to as the "received modified error check symbols" to generate what may be hereafter referred to as a "partial syndrome"; generates for each member of the attribute data class a set of error check symbols. hereafter referred to as the "attribute error check symbols"; and combines the partial syndrome with each set of attribute error check symbols to generate a series of symbol groups or symbol patterns which will hereafter be referred to as "syndromes"; and performs a zero detect operation on each syndrome to determine which syndrome is all zeros so as to determine the identity of the selected member of the class of attribute data which was encoded on the transmitter side.

In a second embodiment of the invention, the receiver side circuitry should be understood as referring to that circuitry that does the following: concatenates each member of the attribute data class, one member at a time, with the received main data; generates error check symbols (hereafter referred to as "third error check symbols") for each combination of one member of the attribute data class with the received main data; combines each group of third error check symbols with the modified error check symbols as received, hereafter referred to as "received modified error check symbols" to generate a plurality of syndromes; and performs a zero detect process on each syndrome to determine which syndrome is all zeros and, thus, which member of the attribute data class was encoded on the transmitter side. Hereafter, the act of transferring the data between the transmitter side and the receiver side will be referred to only as transmission although recording of the data with later replay is also included within the term transmission.

As used herein, a "word" will be understood as referring to a fixed number of symbols, and the main data field concatenated with its error check symbols may or may not be, but usually is, equal to one word in length depending upon the particular embodiment of the invention being considered. The term "symbols" will be used to refer to the individual components of main data field or any of the error check fields and should be understood as meaning binary bits in the case of binary number system embodiments of the invention or other individual digits in alternative number systems in which the invention may be implemented such as Reed-Solomon code. The number systems that may be used to practice the invention are discussed more fully below.

The following labels will be used as shorthand to refer to various symbol fields defined above and used in the drawings and the written description of embodiments of the method and apparatus of the invention.

Ax = the selected member of the class of attribute data members which is to be encoded into the error check symbols for the main data, i.e., the "attribute data".

D = the main data which is to be transmitted, i.e., the "main data".

Pd = the error check symbols which would be generated by the transmitter side circuitry if the input field were D or D concatenated with sufficient leading zeros to make up one word at the input of the error check bit generation circuitry, i.e., the "first main data error check symbols".

Pax = the error check symbols for Ax alone or ax concatenated with sufficient trailing zeros to make up one word calculated on the transmitter side, i.e., the "attribute error check symbols" where this term is to be understood as meaning the symbols which uniquely identify the member of the attribute data class to which they correspond and not as symbols to be used for error detection and correction of the attribute data. In the claims the term "attribute error check symbols" should be understood as a unique code word identifying the particular member of the attribute data class to which the code word corresponds regardless of whether an error correction code or some other code was used to generate the attribute error check symbols. In some embodiments, the attribute error check symbols may be the attribute data itself as long as the attribute data field is less than or equal to the length of the Pd. These embodiments will be hereafter defined and referred to as the decomposed embodiments.

p = the first error check symbols encoded with the attribute error check symbols as generated on the transmitter side which are transmitted (regardless of the manner in which they are calculated), i.e., the "modified error check symbols".

D' = the version of the main data which is received by the receiver side after transmission, i.e., the "received main data". This version may have errors in it because of errors introduced in the transmission process.

P' = the version of the modified error check symbols received at the receiver side, i.e., the "received modified error check symbols" (this version may have errors in it because of errors introduced in the transmission process).

Pd' = the error check symbols which are generated by the receiver circuitry using D' or D' with sufficient leading zeros to make up one word as the input field to the receiver side error check bit calculation circuitry, i.e., the "second main data error check symbols".

P" = the receiver side modified error check symbols generated by taking Pd' and encoding Pax therein in the same manner as Pd had Pax encoded therein on the transmitter side, i.e., hereafter the "presyndrome".

syndrome = the result of a logical operation between P' and P".

Pal' ... Pax' ... Pan' = the error check symbols supplied to the decoder circuitry on the receiver side and corresponding to the members of the attribute data class A1 ... Ax ... An to allow mathematical deduction of the identity of Ax, i.e., the "attribute error check symbols" where this term is to be understood as meaning the symbols which uniquely identify the member of the attribute data class to which they correspond and not as symbols to be used for error detection and correction of the attribute data. In the claims, the term "attribute error check symbols" should be understood as a unique code word identifying the particular member of the attribute data class to which the code word corresponds regardless of whether an error correction code or some other code was used to generate the attribute error check symbols. "Attribute error check symbols" should not be understood as indicating that the symbols are used to error detect and correct the attribute data to which they correspond. In some embodiments, the attribute error check symbols may be the attribute data itself as long as the attribute data field is less than or equal to the length of the Pd field. These embodiments will hereafter be defined and referred to as the decomposed embodiments.

Pax' = the error check bits on the receiver side corresponding to the selected member of the attribute data class chosen on the transmitter side where this term is to be understood as meaning the symbols which uniquely identify the member of the attribute data class to which they correspond and not as symbols to be used for error detection and correction of the attribute data. In the claims the term "attribute error check symbols" should be understood as a unique code word identifying the particular member of the attribute data class to which the code word corresponds regardless of whether an error correction code or some other code was used to generate the attribute error check symbols. In some embodiments, the attribute error check symbols may be the attribute data itself as long as the attribute data field is less than or equal to the length of the Pd field. These embodiments will hereinafter be defined and referred to as the decomposed embodiments.

alpha = the selected mathematical and/or logical operation or sequence of operations which are used to encode the attribute error check symbols into the first error check symbols on the transmitter side and for selected operations on the receiver side. The preferred alpha operator is the logical exclusive-or operation since the preferred number system is binary.

$alpha^{-1}$ = the inverse operation or reverse sequence from alpha which may hereafter be called alpha inverse or the inverse operator. For certain situations such as nonlinear codes or linear codes where alpha is not restricted to those alpha having a defined inverse operator, $alpha^{-1}$ may not be defined or may not be unique.

the identity operator = any mathematical or logical operation which can determine if two groups of symbols are identical. In the case of binary codes or any code which has symbols which may be expressed as binary n-tuples, the exclusive-or or X-OR operation is a simple wy of performing the identity operation. However, this operator may also represent a bit for bit or a symbol for symbol comparison in a comparator etc. The identity operator may take any form regardless of the character of the alpha operator although the X-OR operation is preferred since it is a simple operation in the preferred binary code system.

It should be understood that the teachings of the invention are equally applicable to all number systems in which the data or error check symbols are expressed. Some other embodiments of the invention also use other mathematical operations which are defined for the binary number system. Any number system may be used to practice the invention so long as the necessary mathematical operations are defined in the number system of interest.

In the broadest sense, the generic method of the invention involves generating error check symbols which are modified by the presence of the attribute data or the attribute data error check symbols in the input stream to the circuitry that generates the modified error check symbols. Thus the selected member of the attribute data class is "encoded" into the modified error check symbols which are generated using the alpha operator. The identity of the selected member of the attribute data class which was encoded on the transmitter side is "decoded" on the receiver side. The process performed on the receiver side involves generally performing the inverse alpha operator between P' and Pd' to arrive at Pax' if the inverse alpha operator is defined. From Pax' the identity of the attribute data can be derived.

Where the inverse alpha operator is either not defined or not unique, different embodiments exist. If the inverse alpha operator is not defined, the receiver, side circuitry may combine Pd' with each of Pal' ... Pan' to generate a plurality of P". Each P" is compared to P' by the identity operator to determine the identity of Pax'. Pax" will be the one member of the class Pal' ... Pan' which results in a P" which is identical with P'. If the inverse alpha operator is not unique, there will be ambiguity where several of the group Pal' ... Pan' satisfy the condition P' $alpha^{-1}$ Pd' (if $alpha^{-1}$ is defined and unique, then only Pax' satisfies this condition). In environments where this ambiguity is not critical, the output can indicate which of Pal' ... Pan' satisfy the condition. In environments where the ambiguity cannot be tolerated, the receiver side circuitry must perform the operation Pd' alpha Pax' for all the possible Pax' that satisfy the condition to generate a plurality of P" and then compare all the P" so generated to P' using the identity operator to determine the true identity of Pax'. Pax' will correspond to the member of the ambiguous subset within the set Pa1'... Pax' which resulted in a P" which is identical to P'.

In some embodiments, the receiver side circuitry generates syndromes for each member of the attribute data class by performing an exclusive-or logical operation or its equivalent between the received modified error check symbols and the presyndrome generated for each member of the attribute data class. The first syndrome detected which is all zero identifies the member Ax of the attribute data class which was selected on the transmitter side for encoding to generate the modified error check symbols.

Any error correction code can be used to practice the invention. However, the inverse alpha operator will be defined only for alpha operators in a restricted class where a linear error correction code is used and alpha is taken from the algebraic body on which the linear error correction code is defined. If a nonlinear error correction code is used, or if a linear error correction code is used with alpha not restricted to the class of alpha operators for which inverse alpha operators are defined, then the receiver side circuitry must perform trial and error matching procedures to eliminate the ambiguity and find the true Pax. Any mention of a linear error correction code herein should be understood by those skilled in the art to mean that the invention can also be practiced with nonlinear error correction codes except that the receiver circuitry may have to do trial and error matching steps to "decode", i.e., identify the true Pax and ax.

The invention can be practiced in at least two known embodiments referred to herein as the decomposed method and the direct method. In a broad sense, the following method defines a generic form of the preferred decomposed method in which the invention may be practiced. Other decomposed methods discussed later herein and the apparatus to perform these methods are the preferred embodiments of the invention and are species of the broad genus to follow. The generic method of practicing the preferred decomposed method of the invention involves the following sequence of steps: calculate the first error check symbols from the main data using any error correction code, which error correction will hereafter be referred to as ECC 1; select the member Ax of the attribute data class to be used and calculate the attribute error check symbols Pax from the selected attribute data Ax using any error correction code, hereafter referred to as ECC 2, which may or may not be different from ECC 1; encode the attribute check symbols Pax into the first error check symbols Pd using any sequence of mathematical and/or logical operations between the two sets of error check symbols or the result of a previous mathematical operation, i.e., combine Pd and Pax using the alpha operator, to generate the modified error check symbols P which are to be transmitted; transmit the main data D and the modified error check symbols P (in binary code embodiments, alpha is preferably the exclusive-or logical operation); using ECC 1, calculate the second main data error check symbols Pd'; apply the inverse alpha operator between P' (the received modified error check symbols) and Pd' to derive Pax' and therefore where the inverse alpha operator is defined and unique; and, translate the derived Pax' to the selected for transmission on the transmitter side corresponding member Ax of the attribute data class.

In cases where the inverse alpha operator is not defined or is not unique, a trial and error method of decoding is used on the receiver side. In these embodiments, Pd' is generated using ECC 1 and is combined using the alpha operator with each Pa1'... Pan' or with each Pa in the class of Pa1'... Pan' which satisfies the condition represented by P' and Pd'. Each such combination yields a presyndrome P". Each such presyndrome is compared to P' using the identity operator to determine the identity of Pax'. Pax' will correspond to the member of the class Pa1'... Pan' which resulted in a P" which was equal to P'.

From the above description of the decomposed method, it can be seen that if the number system chosen has all the mathematical operations needed in the above process defined for it, the number system will be satisfactory. If the number system can be mapped to a corresponding binary number of 0's and 1's the foregoing requirement will always be met. As an example, the invention will work for both main data and error check symbols which are expressed either in binary where there are only two symbols are defined (logic 1 and logic 0) or it will work where the data and error check symbols are expressed in Reed-Solomon code where there are 16 symbols defined, each of which can be mapped to a binary nibble of four binary bits.

The teachings of the invention, in the preferred species of the decomposed embodiment, include a method and apparatus for encoding attribute error check symbols generated from a selected member of a class of attribute data members into the first error check symbols for the main data. The modified error check symbols may then be transmitted over any medium along with the main data symbols to which they apply. Neither the symbols representative of the selected member of the class of attribute data members nor the attribute error check symbols generated from the selected attribute data member are directly or separately transmitted.

Narrowly speaking, the details of the preferred decomposed method using binary code and the exclusive-or logic operation as the alpha operator involve separate error check symbol calculations on various fields and the combination of the results using the exclusive-or logical operation. In this method, the encoding operations on the transmitter side are done individually on the main data D and the attribute data Ax and the resulting error check symbols are combined by an exclusive-or logical operation to generate the modified error check symbols P. That is, on the transmitter side in the decomposed method, the error check symbols Pd are generated by using one encoder having as its input field D concatenated with sufficient leading zeros to make up one word. The error check symbols Pax are generated by another encoder which has as its input Ax concatenated with sufficient trailing zeros to make up a word at the input of the encoder. The invention works best with a limited class of attribute data members. In embodiments where the class of attribute data members is sufficiently small, the error check symbols Pax may be supplied from a look-up table or some other non-calculating circuit which can rapidly translate between Ax and its corresponding error check symbols Pax rather than calculating Pax using an error correction code.

After the error check symbols Pax and Pd have been generated, these two fields are combined by performing an exclusive-or logical operation between the two fields. This is the process of encoding the error check symbols Pd with the error check symbols Pax of the selected member of the attribute data class. Following the encoding process, the main data D and the modified error check symbols P are transmitted. In some embodiments ("super channel" embodiments), the data field comprised of D concatenated with P may be used as the input field for a separate error checking system which forms a part of the transmission link system. This separate error checking system generates separate error check symbols P* on the input field D concatenated with P in the trailing bit positions. These separate error check symbols P* may be generated with any error correction code the selection of which is not critical to the invention. These separate error check symbols P* are transmitted with the main data, and are used after the transmission by separate error correction and detection circuitry on the receiver side to correct those errors which occurred which are within the range of correctable errors. Any errors which are not within the range of correctable errors, but which are in the range of detectable errors may be signaled to cause a retransmission.

Regardless of whether the above error correction process is performed before the receiver side circuitry begins its function, the receiver side circuitry does the same function in all the decomposed method embodiments. That function is to decode the incoming data to determine the identity of the attribute data Ax which was selected for encoding into the main data error check symbols $P_D$. This is done, in the preferred embodiment with a foreshortened error detecting code, by concatenating sufficient leading zeros in the leading bit positions of D' to make up one input word to an encoder. The encoder then generates Pd' in the same manner as Pd was generated on the transmitter side. The value of Pd' is then supplied as one input to a partial syndrome generator which generates a partial syndrome by performing an exclusive-or logical operation between the received modified error check symbols P' and Pd'.

A separate circuit then supplies each of the possible values for Pa', i.e., one Pa' is supplied for each member of the attribute data class to a syndrome generator. In the preferred embodiment, the values for Pa are supplied from a look-up table. In other embodiments, they may be calculated with an encoder.

The syndrome generator then generates a syndrome by performing an exclusive-or logical operation between each of the possible values for Pa' and the partial syndrome. Because of the properties of the exclusive-or logical operation and the methodology of generating the various input data quantities, the syndrome which consists of all zeros identifies the Pax which was encoded into Pd, and, thus, identifies the particular attribute data which was selected for transmission. The main data D' and its associated attribute data Ax are then ready for use in display, signal processing or any other manner desired by the user.

In an alternative embodiment of the above decomposed method, the inverse alpha operator would be defined and unique as can be seen from the truth table of an exclusive-or function assuming that Pd and Pa and P are all one bit binary data fields. Instead of performing an exclusive-or operation between $P_D$ and each member of the class of Pa1' ... Pan', the inverse alpha operator could be applied between P' and Pd' to derive Pax' in one operation.

Another method of communicating attribute data without actually transmitting same is the direct method. In this method, the transmitter side encoder has as its input field a code word comprised of D concatenated with Ax where Ax occupies the most significant bit positions of the input code word (foreshortened error detection code embodiments). In alternative embodiments, Ax may be placed elsewhere in the input word to the encoder such as in the least significant bit positions. The encoder then generates the modified error check symbols P from the single input word of D concatenated with the selected Ax. In linear error correction codes, P will be equal to the error check symbols Pd mathematically combined with the error check symbols Pax. In the most general embodiment, the encoding process may use an alpha operator which can be any mathematical operation such as addition, subtraction, multiplication division. On any combination of the above may be used. Further, any logical operation may used such as AND, OR or exclusive-or. Or any combination of mathematical and logical operations may be used. As in the case of the decomposed embodiments, direct method embodiments can use either linear error correcting codes or nonlinear error correcting codes. For direct methods using linear error correcting codes with the alpha operator restricted to alpha operators which have a defined inverse alpha operator, the receiver side circuitry can directly decode the identity of Pax using the inverse alpha operator. For direct method embodiments using nonlinear error correcting codes or linear error correcting codes and alpha operators unrestricted to the set of alpha for which alpha$^{-1}$ is defined, the trial and error method of decoding will be necessary to eliminate any ambiguity as to the identity of Pax. In the preferred embodiment, the exclusive-or logical operation is used for the encoding and decoding. D and p are then transmitted.

On the receiver side, for embodiments where the inverse alpha operator is not defined, each member of the class of attribute data is essentially concatenated into the leading bit positions (or the same bit positions in which the selected Ax was catenated on the transmitter side). This concatenated field will then be used as the input code word for another encoder. This encoder calculates the error check symbols P" from the input word D' concatenated with each possible members of the attribute data class. There will thus be a P" for each member of the attribute data class. The values of P" are supplied to the input of a syndrome generator which generates a syndrome for each P" by performing an identity comparison between all P" so generated and P'. In the preferred binary embodiments, the identity test is the exclusive-or logical operation between each P" and P', the received version of the modified error check symbols. The syndrome which comes-out all zeros identifies the particular value which was selected for encoding on the transmitter side.

The apparatus of the invention to implement the decomposed method may be either serial or parallel in architecture or some combination of the two. That is, the transmitter and receiver sides may both be purely serial or purely parallel or somewhere between the two extremes. Further, the transmitter side may be serial and the receiver side may be parallel or vice versa. The decomposed pure serial and pure parallel which are described in detail in the detailed description below. For brevity, these embodiments will not be summarized here since those skilled in the art can appreciate many variations of the decomposed and direct methods described above.

The apparatus for the direct method may also be implemented in either a serial or parallel architecture or some combination of the two. Like the decomposed method, the transmitter side and the receiver side may each be serial or each be parallel, and each may have some degree of parallelism somewhere between the two extremes. Further, the transmitter side may be serial and the receiver side may be parallel or vice versa.

BRIEF DESCRIPTION OF THE DRAWINGS

FIG. 1A is a conceptual flow diagram of the decomposed method of practicing the invention where the alpha operator is the exclusive-or logical function.

FIG. 2B is a conceptual flow diagram of the changes to the embodiment of FIG. 2A on the receiver side where the alpha operator is selected such that the inverse alpha operator, is not defined or not unique.

FIG. 2C is a conceptual flow diagram of the changes to the embodiment of FIG. 2A on the receiver side where the alpha operator is selected such that the inverse alpha operator is defined and unique.

FIG. 7A is a flow diagram of a general method of practicing the decomposed method of the invention using any alpha operator including the exclusive-or logical operation where the inverse alpha operator is defined and unique..

FIG. 7B is a flow diagram of the changes to the method of FIG. 7A where alpha is selected such that the inverse alpha operator is either not defined or not unique.

DETAILED DESCRIPTION OF THE INVENTION

Figure 1B:
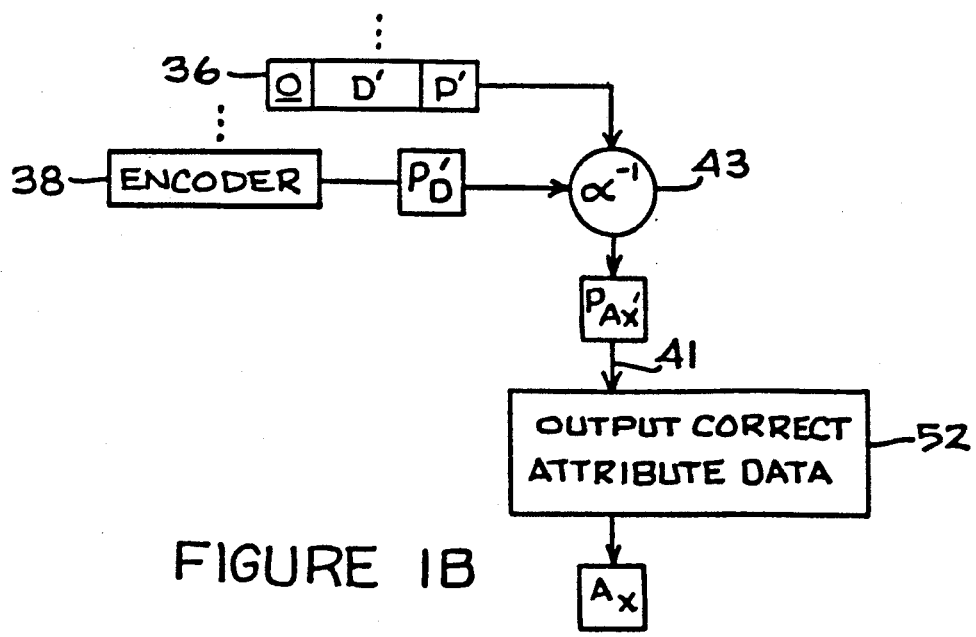
FIG. 1B is a conceptual flow diagram of the to the embodiment of FIG. 1A on the receiver side where the alpha operator is selected such that the inverse alpha operator is defined and unique.

Referring to FIG. 1A, there is shown a flow diagram for the decomposed method of practicing the invention with the alpha operator as the exclusive-or logical operation. This is a trial and error embodiment. The decomposed method involves encoding the error check symbols from a selected member Ax of a class of attribute data members into the error check symbols $P_D$ for so-called main data D to be transmitted to generate modified error check symbols P for transmission with the main data. The receiver side method steps serve to evaluate the incoming data to identify the particular member of the class of attribute data members which was selected for encoding on the transmit side and to output that data.

The first steps in the decomposed method of the invention are to compute the error check symbols Pd for the main data and to compute the attribute error check symbols Pax, for a selected member Ax of the class of attribute data members. The Pax check symbols are not actually used to detect and correct errors in the attribute data. Indeed, they may be the attribute data itself in some embodiments or they may be some encoding of the attribute data into a code word Pax uniquely identifying the attribute data with which it is associated.

In the preferred embodiment, Pd is calculated by concatenating leading zeros into the unused bit positions of the main data D as shown at 20. Those skilled in the art will appreciate that the leading zeros are not necessary to define the magnitude of D, and therefore this step may be omitted. The same general comment applies to all steps in all methods described herein for concatenating leading zeros and the circuitry described herein to implement such steps. Such steps and circuitry may be omitted. Any step defined herein which concatenates trailing zeros and any circuitry which implements such a step in any of the embodiments described herein may not be omitted however since trailing zeros are necessary to define the magnitude of a digital number.

In the preferred embodiment, a sufficient number of leading zeros are added to the main data to make the concatenation of the leading zeros plus the main data D plus the error check symbols Pd which will be generated from the main data equal the number of symbols in one word. This concatenation is shown at 22. Pd is calculated by inputting the main data D with its concatenated leading zeros to a conventional encoder 24. This encoder implements any error correction code. There are certain advantages in speed of operation in using linear error correction codes and restricting the alpha operator to those operators for which the inverse alpha operator is defined. The princiPal advantage is that for a defined inverse alpha operator, the identity of Pax can be immediately known on the receiver side from the states of Pd' and P' simply by applying the inverse alpha operator between these two quantities. If the inverse alpha operator is not defined or is not unique, then the receiver side circuitry must go through a trial and error process of elimination until the true Pax is found. This takes extra time. However, the invention may be practiced with either linear error correction codes where the alpha operator is not restricted to alpha operators where inverse alpha is defined and unique or with non-linear error correction codes where inverse alpha is not defined or not unique. An example of an alpha operator which does not have a defined and unique inverse alpha operator is the AND logical operator. The truth table for an AND alpha operator operating on one bit Pd and Pax fields is given below.

| Alpha operator = AND | | |
|---|---|---|
| Pd | Pax | P |
| 0 | 0 | 0 |
| 0 | 1 | 0 |
| 1 | 0 | 0 |
| 1 | 1 | 1 |

Here the alpha operator is the AND logical operation converting the Pd and Pax one bit fields to the one bit P fields in the right column. The inverse alpha operator would be the logic function between P and Pd which yields Pax in the right hand column which is shown below.

| Inverse alpha operator not unique | | |
|---|---|---|
| Pd | P | Pax |
| 0 | 0 | 0 |
| 0 | 0 | 1 |
| 1 | 0 | 0 |
| 1 | 1 | 1 |

Note that for the first states of Pd and P, there two different values for Pax which both satisfy the conditions of Pd and P. This is a case where there is ambiguity in the inverse alpha operator and it is said to be not unique. The only way to attempt to resolve this ambiguity on the receiver side circuitry is to do a trial and error decoding where Pd' and all the Pax in the ambiguous subset are combined with the alpha operator to generate a plurality of P" and to compare each resulting P" and P' to determine which of the Pax resulted in a P" which was identical to P' thereby establishing the identify of Pax' and Pax. In the case at hand, this does not work to resolve the ambiguity, so this alpha operator either cannot be used or the ambiguity must be tolerated. In some applications this may be acceptable and in others, it will not be acceptable. The ambiguity problem becomes less significant when the size of the Pd, Pa and P fields becomes larger. Further, in general, it is true that the number of members in the attribute data class is far fewer than the total number of combinations which can be made with the number of error check bits in the Pd field. The unused combinations can be used to differentiate between the members of the attribute data class which lie in an ambiguous subset. Thus, ambiguity can be removed effectively for any alpha operator such that the invention can be used with any alpha operator, any number system and any error correction code. With the foregoing discussion in mind, the below described various alternative embodiments may be better understood.

The encoder 24 may be a conventional parity generator comprised of a plurality of exclusive-or gates connected in such a manner as to implement the division by a unique generator polynomial said division operation being characteristic of CRC check bit generation. The error check symbols Pd generated by the encoder 24 would then be the coefficients of the remainder polynomial resulting from this division. Such techniques are well known in the art and will not be described further herein.

The invention is not limited to number representation in the binary system. Any number system which can be linearly mapped to the binary form for which there is defined the logical operation and/or the mathematical operations of the alpha operator or the exclusive-or logical operation used in some other embodiments described herein will suffice. Thus, the attribute data A and the main data D may be represented in any code for which the necessary mathematical and/or logical operations are defined. The Reed-Solomon code is an example of one such acceptable code which happens to be a linear code. Whereas binary code has only two symbols which are defined, i.e., 0 and 1, the Reed-Solomon code can have any finite number of symbols equal to a prime number raised to any finite power. One such code has sixteen defined symbols. Each of these symbols maps directly by a mathematical relationship to a nibble of four binary bits. Hereafter, the binary number representation will be used for convenience and the term bits or symbols may be used interchangeably to mean the components in the code "alphabet" which can be concatenated into code words.

The error check bits for the selected member of the class of attribute data members may be supplied in the method of FIG. 1 in any one of many different ways. For example, there may be one bus 27 which supplies each of the members of the attribute data class in a serial stream. The selected member, Ax, may then be picked from the stream by suitable apparatus and converted to the Pax bits. Alternatively, bus 27 may represent a plurality of buses each of which carries one member of the class A1 ... Ax ... An. Suitable apparatus to select the bus carrying Ax such as a multiplexer may be used to supply Ax for encoding into Pax. The apparatus that does the selection in either of these two architectures may be either a bit serial or bit parallel architecture or any combination of architecture between these two extremes. The design of such a functional unit for any such combination is well known to those skilled in the art.

The foregoing statements are true for any of the embodiments described herein. That is, any time multiple units of data such as the members of the attribute data class must be handled in any of the trial and error embodiments to be defined below, the multiple members of the attribute data class may be supplied in a serial data stream in time sequence or simultaneously in parallel on a plurality of data paths. The apparatus that handles data at any point in any of the embodiments defined or pointed to herein may be bit serial, bit parallel, byte serial, byte parallel, word serial, word parallel, group serial or word parallel or any architecture between the serial and parallel extremes. In other words, regardless of whether serial or parallel architectures are chosen to handle the multiple members of the attribute data class, each functional unit in any of the embodiments described or pointed to herein such as encoders, concatenators, ALU's, bit strippers, logic gates or logic function operators, multiplexers, output circuits, identity detectors and so on may have a serial or parallel architectures organized by bit, byte, word or group. Which architecture is chosen is a matter of design choice based on speed, cost or other constraints. The details of the various architectures for the functional units will be apparent to those skilled in the art. Only the details of the functions performed and the sequence in which they are performed in various embodiments are given here. That is, some of the permutations of the various methods, the various conditions for the alpha operator and the various overall architectures for handling multiple elements of data are described below. No attempt has been made here to define each possible circuit for each functional unit in the embodiments described since there are a large number of permutations, and the circuits can easily be designed by those skilled in the art given the guidance on the functions to be performed and the sequence in which to perform the functions in the various embodiments set forth herein.

The step of supplying the proper error check bits corresponding to the selected member Ax from the attribute data class is symbolized by block 28 in FIG. 1. As an example of how this step 28 may be implemented, the error check bits pa may be calculated using an encoder such as the encoder 24 or using an encoder which implements another error correction code other than the one implemented by the encoder 24. In such an embodiment, trailing zeros would be concatenated with the selected attribute data member starting at the least significant bit end. Further, the step 28 may represent any encoding of the attribute data 26 into a code word pa of a length equal to or less than the length of the length of the Pd field. In some embodiments, where the attribute data 26 is of a field length of less than or equal to the length of the Pd field, the step 28 may represent the process of supplying the attribute data itself for encoding with the Pd symbols to generate the p symbols although this method is not preferred. The resultant input code word is shown at 26. The output code string would be the attribute error check symbols Pax. In alternative embodiments, the attribute error check bits Pax could be supplied by a look-up table where the input address corresponded to the selected member of the lass of attribute data members. For each such member in the attribute data class, there would be stored in the look-up table the corresponding attribute error check bits which would result if each member of the attribute data class were encoded to its corresponding error check bits by an encoder such as that shown at 24 in FIG. 1. Another embodiment would use a multiplexer having one input port for each member of the class of attribute data members. Each input port would be hard wired with the bit pattern of the attribute error check bits for its corresponding member of the attribute data class. A select signal would then control which of the inputs was connected to the output port to thereby control the multiplexer to supply the attribute error check bits for the selected member Ax of the attribute data class.

The process of modifying the error check bits Pd for the main data with the attribute error check bits from the selected member of the attribute data class is symbolized by the alpha operator shown at 30. In the preferred embodiment, the binary number system is used, and the alpha operator is the exclusive-or logical operation, but in other embodiments, any alpha operator may be chosen. Both the attribute error check bits Pax for the main data Pd and the error check bits for the selected member of the attribute data class are data fields of the same predetermined number of bits. The number of bits is selected by the user, depending upon the reliability needs and other characteristics of the system in which the invention will be used. The alpha operator shown at 30 in FIG. 1 represents either a bit-for-bit exclusive-or operation between each bit of Pd and its corresponding bit in Pax or whatever other mathematical and/or logical operation or sequence of operations which is selected for the alpha operator.

For purposes of simplicity, the alpha operator will be assumed to be the exclusive-or logical operation as in the preferred embodiment. However, the alternate embodiments where alpha is not the exclusive-or operation and the inverse alpha operation is defined will be described as well as the alternate embodiments where the inverse alpha operator is either not defined or not unique will also be described in connection with discussion of various ones of the figures included herewith.

In the preferred embodiment, the output of the bit-for-bit exclusive-or operation at 30 is the field of modified error check bits P. This field is concatenated with the main data bits D. The modified error check bits P are placed in the least significant bit positions (it does not matter where they are placed as long as the they can be recovered as an intact P field on the receiver side). The combined field comprised of the main data D and the modified error check bits P are then transmitted and/or recorded as symbolized by the transmission link 32 in FIG. 1. The attribute data Ax need neither be transmitted nor recorded, since its identity is encoded into the error check bits P.

Figure 1C:
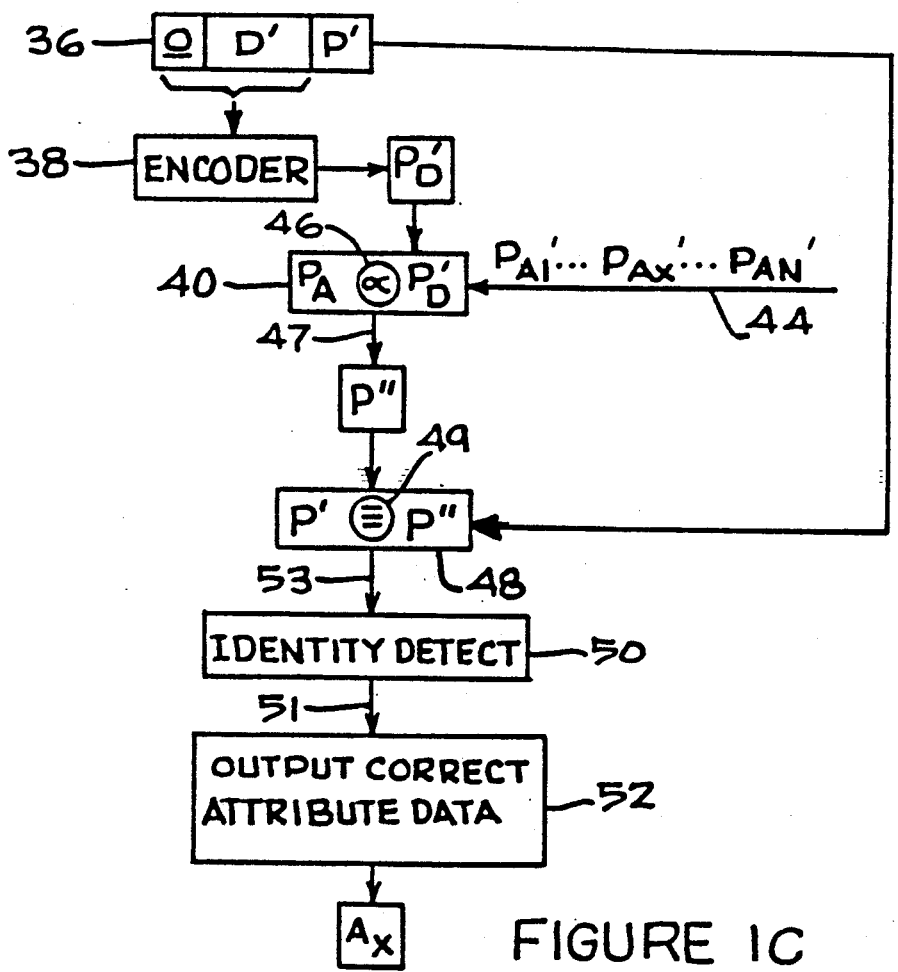
FIG. 1C is a conceptual flow diagram of the changes to the embodiment of FIG. 1A on the receiver side where the alpha operator is selected such that the inverse alpha operator is not defined or not unique.

On the receiver side, the methodology of the invention depends upon whether inverse alpha is defined or is not defined or not unique. FIG. 1A shows a receiver with a trial and error configuration. FIG. 1B shows a receiver where inverse alpha is defined and unique, so no trial and error is needed. FIG. 1C shows another trial and error receiver. The first step in all alternate embodiments of FIGS. 1A, 1B and 1C is to concatenate a string of leading zeros into the most significant bit positions of the received data D', as symbolized by the exclusive-or logical operation at 34. Those skilled in the art will appreciate that leading zeros are not significant in defining the value of a digital number, and thus, this step may be omitted if desired without changing the result. If this step is used, the output of the exclusive-or operation at 34 is the bit pattern shown at 36. The bit pattern at 36, like the bit pattern at 22, is one word in length for embodiments utilizing foreshortened error correction codes. The portion of the bit pattern 36 comprised of the received main data D' and the leading zeros are applied as the input string to an encoder 38. This encoder 38 must implement the error correction code implemented by the encoder 24 on the transmitter side, and outputs the error check bits Pd'.

In the embodiment shown in FIG. 1A, the exclusive-or logical operation is used for the alpha operator, and a trial and error method is used to determine the identity of Pax. In this embodiment Pd' and each of the members of the class Pa1' ... Pan' (identical to Pa1 ...

Pan on the transmitter side are combined in the exclusive-or logic operation symbolized at 40 to yield a plurality of P″ fields. The members of the class Pal′ ... Pan′ are input on the bus 44. To illustrate the point made earlier about serial and parallel architectures, the members of the class Pal′ ... Pan′ may be supplied for trial and error evaluation either in serial form on the bus 44 or the bus 44 may represent a plurality of parallel buses, each of which carries one member of the class Pal′ ... Pan′. Regardless of which architecture is elected to supply the members Pal′ ... Pan′ to the exclusive-or functional unit 40, the unit 40 may be designed in either a serial or parallel architecture or any architecture between the two extremes. For example, if the incoming data is a serial bit stream, Pal′ may be assembled in a serial-in-parallel-out shift register and the parallel outputs may all be simultaneously combined in a plurality of exclusive-or gates each of which combines one bit of the Pal field with the corresponding bit of the Pd′ field. Likewise, if the input stream is arriving serially, the unit 40 could be comprised of a serial-in-serial-out shift register. As the bits of the the class Pal′ ... Pan′ arrive, they may be shifted along the shift register and combined at the shift register serial output in a single exclusive-or gate with the corresponding bits of the Pd′ field. Similar architectures may be described for the unit 40 where the members of the class Pal′ ... Pan′ arrive simultaneously on a plurality of buses. The foregoing generalities apply equally to all functional units in all the embodiments.

The plurality of P″ fields generated by the unit 40 are then compared to the P′ field in an identity tester unit 48. The output of the identity test on bus 53 is a plurality of syndromes. The operator at 49 represents any identity operator symbolizing any circuitry which can determine when two code words are identical. In binary embodiments, this identity operator can be exclusive-or gates since the exclusive-or of two identical code words is always zero. The syndromes on bus 53 are then examined to determine which is zero as symbolize step 50. The zero syndrome corresponding to Pax′ (and Pax) causes the circuitry symbolized by step 52 to output the correct attribute data Ax as symbolized by data path 51.

Referring to FIG. 1B, there is shown an embodiment where the inverse alpha operator 43 is defined and unique. All the functions prior to the inverse alpha function 43 are the same as described above with reference to FIG. 1A and will not be discussed here. In this embodiment, the identity of Pax can be directly determined by performing the inverse alpha operation between Pd′ and P′ to compute Pax′ as symbolized at 41. From Pax′, the correct corresponding attribute data Ax may be output as symbolized by data path 41 and step 52.

FIG. 1C shows an alternative embodiment where the inverse alpha operator is not defined or not unique, and a trial and error method must be performed. In this embodiment, all the steps are the same as described above for FIG. 1A, except that the unit 40 combines each member of the class Pal′ ... Pax′ ... Pan′ with the field Pd′ using the alpha operator instead of the exclusive-or logical operation to yield a plurality of presyndromes P on the data path 47. These P″ data fields are each combined with the P′ field by the identity operator 49. The results of this operation determine which P″ corresponds to Pax′. If the identity operator 49 is the exclusive-or operation, the identity detect circuitry 50 is a zero detector which receives the output of the exclusive-or operation on data path 53 and outputs Pax′ on data path 51 to the output circuit 52 which outputs the correct attribute data. The details of such embodiments where any general alpha operator is used are given in connection with the discussion of FIGS. 7 and 8 below.

There follows with reference to FIG. 1A a more detailed discussion of the embodiment of the decomposed method where the alpha operator is the exclusive-or logical operation and a trial and error decoding method is used. In the trial and error embodiments, the members of the class Pal′ ... Pan′ may be supplied either concurrently or in serial fashion as will be shown in more detail below. This operation is symbolized by the error check bit supply step 42, and may be implemented by any of the apparatus noted above as suitable circuitry for implementing the error check bit supply step 28 on the transmitter side. In the preferred embodiment, the error check bit supply steps 28 and 42 are implemented by either look-up tables or multiplexers with hard-wired inputs. Since calculation of error check bits from an input string is more time consuming than either looking up the error check bits for a given attribute data member or selecting the proper input from a multiplexer having its inputs hard wired in the error check bit pattern of the various attribute data members, the preferred embodiment uses these techniques rather than calculating the Pax bits. In embodiments where the step 30 is some encoding process other than exclusive-or, and the decoding process is a reversal of the encoding sequence, the step 42 of supplying all the attribute error check bits of each member of the attribute data class is not necessary and may be omitted.

The general methodology which is utilized on the receiver side for the trial and error embodiments where the exclusive-or logic function or where inverse alpha is not defined or not unique is to supply the attribute error check bits for each possible member of the class of attribute data members to a syndrome calculation apparatus. As each set of attribute error check bits for a particular member of the class of attribute data members is supplied, a syndrome is calculated by performing an exclusive-or logical operation or the alpha operation between Pd′ and the attribute error check bits for the selected attribute data member. There is one such presyndrome calculated for each member of the class of attribute data members. The presyndromes are then compared one by one to the P′ field by an identity operator which preferably is an X-OR gate to generate a plurality of syndromes. The particular syndrome which is all zeros will identify, assuming there are no errors in transmission, the particular attribute data member Ax which was selected for encoding by the transmitter side. The step or steps of supplying the error check bits for the individual members of the class of attribute data members is symbolized by the bus 44 in FIG. 1A. Each syndrome calculated in FIG. 1A is equal to P′ exclusive-or'ed with P″, where P″ is equal to Pax′ exclusive or'ed with Pd′.

From inspection of the generation of P on the transmitter side, it will be apparent that the modified error check bits P are equal to the quantity Pd exclusive-or'ed with the quantity Pax. On the receiver side, the quantity Pd′ exclusive or'ed with Pax exclusive-or'ed with P′ equal to zero which is also equal to P′ exclusive-or'ed with P″ (it is also equal to $P_D$ X-OR Pax X-OR P). Thus, if there are no errors in the transmission of P, P′ matches P on a bit-for-bit basis, and P″ exclusive-or'ed with P′ is all zeros. This situation will only occur when the attribute error check bits Pa′ supplied by the error check bit supply circuit 42 match the error check bits Pax supplied by the error check bit supply circuit 28 on the transmitter side. Thus, in a serial embodiment, when the error check bits Pax for the particular member of the attribute data class which was selected for encoding on the transmitter side appear at the presyndrome calculation apparatus symbolized,-..t 40 in FIG. 1A, then the syndrome appearing at the input of identity detection circuit 50 on bus 53 will be all zeros when the identity operator 49 is the exclusive-or logic operation. When the attribute error check bits supplied by the attribute error check bit supply step 42 correspond to a member of the attribute data class which was not selected for encoding on the transmitter side, then the syndrome on bus 53 will not be all zeros.

After the syndrome calculation in FIG. 1A, the syndromes are sent to an identity detection step, as preferred embodiment, is a zero detector. If the syndromes are supplied serially on bus 53, then the zero-detect step will generate a signal which indicates an all-zero syndrome only at the particular time when the error check bits Pax' corresponding to Pax arrive at the syndrome calculation step.

The final step in the decomposed method is to output the correct member Ax of the attribute data class corresponding to the all zero syndrome. In a machine, this would be done by monitoring the output of the zero-detect circuit while keeping track of the correspondence between the particular attribute error check bits Pa1... Pan supplied to the syndrome calculation circuit and their corresponding attribute data $A_1$... Ax... An. When the output of the zero detect circuit indicates an all zero syndrome has been calculated, the corresponding Ax which resulted in the all zero syndrome is looked up and output by the unit 52.

The super channel steps shown in the phantom lines in thee transmission link will be discussed further below in connection with a discussion of another embodiment.

Figure 2A:
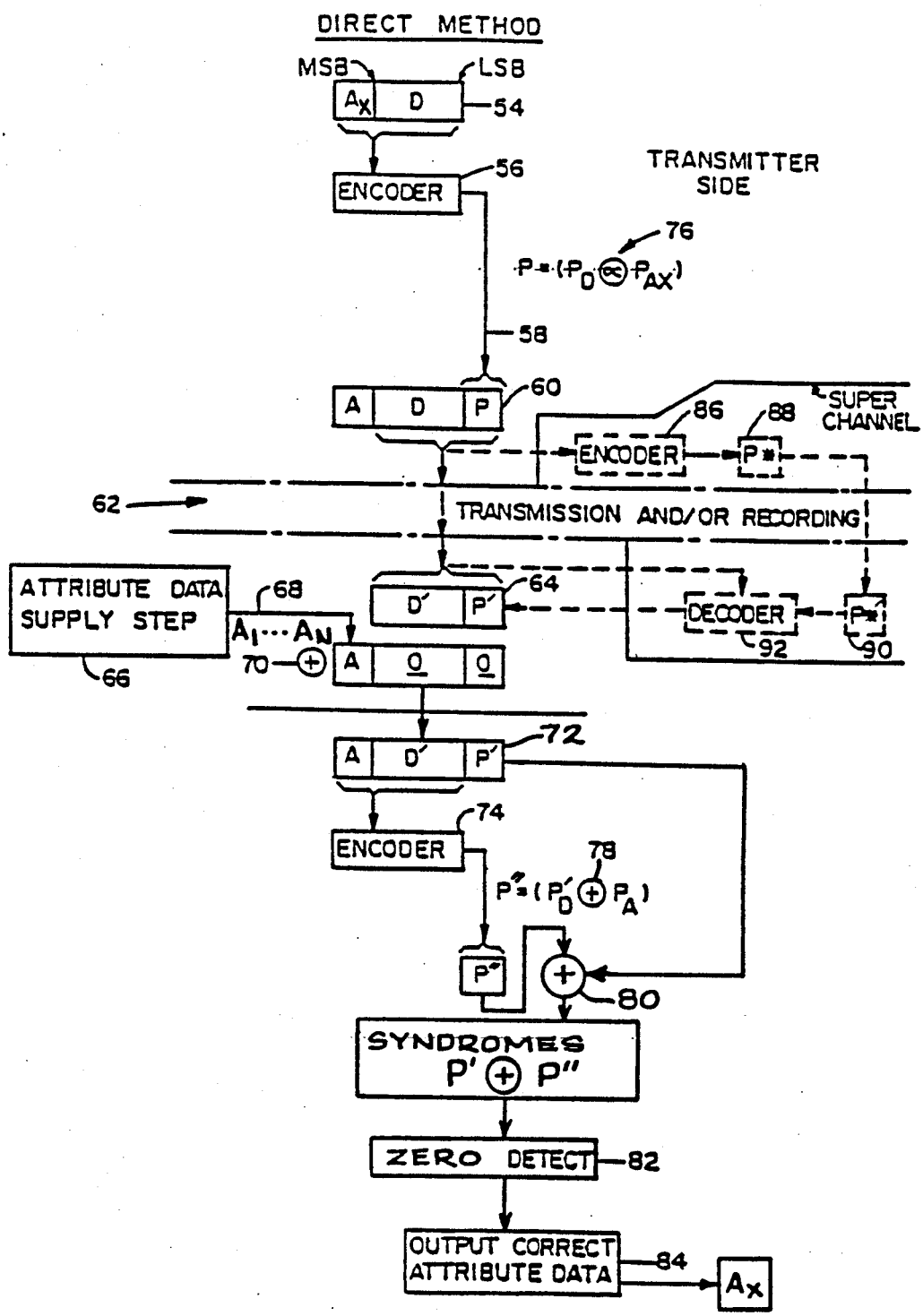
FIG. 2A is a conceptual flow diagram of the direct method of practicing the invention where the alpha operator is the exclusive-or logical function.

Referring to FIG. 2A, there is shown a conceptual flow diagram for the direct method of practicing the invention where the alpha operator is the exclusive-or logical operation. Although the algorithm is described in terms of a direct method, the steps shown in FIG. 2A also work for the decomposed method. The direct method differs from the decomposed method in the sense that, on the receiver side, the decoding process requires an error check bit calculation for every member of the attribute data class when concatenated with the D' string, whereas in the decomposed method, the attribute error check bits for attribute data may be looked up.

The direct method on the transmitter side starts with a concatenation of the selected member AX of the class of attribute data members into the unused, most D significant bit positions left open by the main data D in foreshortened linear error detection code embodiments (the attribute data bits may also be put in the least significant bit positions, as long as the same thing is done on the receiver side). The resultant bit string is as shown in 54 in FIG. 2A. String 54 is used as the input string for encoder 56.

The encoder 56 can be any encoder which implements any error correction code. In the preferred embodiment, the encoder 56 calculates the error check bits P directly from the input bit string 54. This operation is equivalent to an embodiment wherein a separate calculation of the error check bits Pd on the main data D and error check bits Pax on the selected member of the class of attribute data members is performed. The error check bits Pax for the attribute data would then be encoded into the error check bits Pd for the main data by performing a bit-for-bit exclusive-or in the encoder 56 as symbolized by the alpha operator 76. Those skilled in the art will appreciate that the alpha operator 76 may be any of the types of alpha operators defined above in the discussion of the decomposed method, and the variations on the receiver side will be detailed below in connection with the discussion of FIGS. 2B and 2C. The direct method then has similar alternate embodiments to those discussed above with reference to the decompose method. As in the case of the decomposed method, the alternative embodiments depend upon the type of alpha operator chosen.

In other embodiments, the encoder 56 could be two separate encoders where one calculates Pax and the other calculates Pd. As discussed above, Pax could be encoded in any manner or may be the attribute data itself as long as the attribute data field length is less than or equal to the field length of the Pd field. The outputs from the two encoders could then be combined using the alpha operator. In the case the embodiment of FIG. 2A, alpha is exclusive-or logical operation. Where the alpha operator is some other function, it can be implemented, for example, by an arithmetic logic unit having its two data inputs coupled to the two data outputs of the two encoders. The arithmetic logic unit could then perform addition, subtractions, multiplication, or division, and/or any logical operation or any combination thereof between the Pd and Pax bits. Each of these different types of mathematical or logical operations would result in a different bit pattern for the modified error check bits P.

After the modified error check bits p are generated, they are concatenated with the main data string on the least significant end thereof. The main data D and the modified error check bits p are then transmitted as shown at 60 and 62 in FIG. 2A. Some embodiments to be discussed below may have separate error correction circuits to safeguard the integrity of this transfer. These so called "super channels" can be used in any of the embodiments discussed herein.

The embodiment of FIG. 2A is a trial and error embodiment. This means that a plurality of data evaluations must be made, one evaluation being necessary for each member of the attribute data class $A_1$... $A_n$ or until the correct attribute data is found. The data Ax evaluation process consists of first calculating a plurality of P'' presyndromes which are Pd' X-OR Pa' for each Pa in the class Pal'... Pan'. Each of the presyndromes P is then matched by an identity test function against the P' field, and the one that matches P' identifies Ax.

The preferred embodiment shown in FIG. 2A uses the exclusive-or logical operation for the alpha operator in a binary number system because the exclusive-or operation is simple to implement with one or more exclusive-or gates, and because it does not change the number of bits in P compared to the number of bits needed to represent Pd or Pax.

The received bit string 64 may or may not have errors introduced therein during the transmission process. It will probably not have errors if a super channel is used especially if the number of transmission errors does not exceed the error detection and correction range of the error correction code used in the super channel. If there are errors in the string 64 resulting from transmission, the invention will not work properly.

The first step in calculating the plurality of P" presyndromes is supplying of each member of the attribute data class A1 . . . An for concatenation with the bit string 64. An attribute data supply step 66 performs this function by supplying each member of the class of attribute data members on bus 68. As noted earlier, the attribute data class members may be supplied serially or in parallel format, and the concatenation apparatus symbolized by the operator 70 may handle the data in serial or parallel form or some compromise between the two extremes. The attribute data on bus 68 is supplied for concatenation into the unused most significant bit positions left open by the received main data D'. This is done by performing an exclusive-or operation symbolized at 70, but this could be any other concatenation operation. The function of the operator 70 is to concatenate the attribute data A with the D' and P' bit strings. The resultant output string is as shown at 72.

Each presyndrome is calculated as follows in the trial and error embodiments where alpha is the exclusive-or logic operation. An encoder 74, which implements the same error correcting code and the same alpha operator 78 as implemented in the encoder 56 is used on the receiver side to calculate a plurality of presyndrome bit patterns P". The presyndromes are calculated using as an input string for each such P" the concatenated string D' and one of the members of the class of attribute data A1 . . . An. This encoding is symbolized at 78.

In the preferred embodiment, the encoder 56 is identical to the encoder 74. In the embodiment of FIG. 2A, the P" error check bit string is equal to the error correction string which would result if the D' string were passed through the encoder 74 alone, i.e., with no attribute data concatenated therewith, and then the resulting error check bits Pd' were exclusive-ored with the attribute error check bits Pa which would result from passing a member of the attribute data class through the encoder 74 alone. The encoding process performed by the encoder 74 must be identical to the encoding process performed by the encoder 56. In other embodiments, if some other mathematical and/or logical operation is used as the alpha operator to encode the Pa attribute error check bits into the Pd error check bits in encoder 56 where inverse alpha is undefined or not unique, then that same alpha operator must be used by the encoder 74.

If there were no errors in transmission, then D' will be equal to D. In such an event, Pd' will be equal to Pd on the transmitter side, and it follows that P" will be equal to P. The syndrome calculation symbolized by step 80 in FIG. 2A is the exclusive-or logical operation between the received, modified error check bits P' and the P" error check bits generated by the encoder 74. If there were no errors in transmission, P' would be equal to P and P would be equal to P". It follows, therefore, that P' will equal P", and that the syndrome consisting of the result of an exclusive-or logical operation between P' and P" would be a string of all zeros. That is only true, however, when the attribute data which was encoded into the P" error check bits on the receiver side was the same attribute data Ax which was encoded by the encoder 56 into the error check bits P on the transmitter side.

It is the purpose of the receiver side circuitry in FIG. 2A, and in FIG. 1A and the other trial and error embodiments described herein to calculate a P" field for each member of the attribute data class until a P" field is found which is an identity with the P' field. The attribute data which resulted in the identity on the receiver side will be the same attribute data as was encoded on the transmitter side. Therefore, the proper attribute data may be output by the receiver side apparatus, even though the attribute data was never transmitted. In the preferred embodiment, a syndrome will be calculated for every member of the attribute data class until an all zero syndrome is found. Each syndrome is P" X-OR P' and will be all zeros if there is an identity between P' and P". These final process steps of detecting when an all zero syndrome occurs and correlating that all zero syndrome to the member of the attribute data class which caused it are implemented in the steps 82 and 84 in FIG. 2A, which are identical to the steps 50 and 52 in FIG. 1A.

As seen from the above discussion, the correct operation of the attribute data recovery method of the invention relies upon the assumption that D' and P' were received correctly and are equal to D and P. If an error does occur in the transmission of either D or P, then an all zero syndrome will not result even when the proper member of the attribute data class is selected for decoding on the receiver side. Thus, the invention is most useful in systems wherein the occasional inability to recover the attribute data will not be fatal. Generally in systems such as color television digital transmission or digital signal processing systems, there is a great deal of redundancy in data from one scan line to the next. In such systems the scheme of the invention works quite well because of the redundancy, and no extra steps to improve reliability need be taken.

However, in systems where errors in transmission would be of some concern, alternative embodiments of the invention may be used to minimize the difficulties caused by such errors. Basically such embodiments involve transmission or recording circuitry which itself has error corrections circuitry which operates independently of the encoders on the transmitter and receiver side of the invention, and which detects and corrects errors which occur during the transmission or recording process before the received data is used by the receiver side circuitry. The nature of such "super channel" embodiments is shown in phantom in FIG. 1A conceptually. The term "super channel" shall hereafter be used to refer to transmission and/or recording circuitry which has separate and independent error correction means therein. Such a super channel embodiment would use an encoder 86 to encode the data to be transmitted into a separate set of error check bits designated P*, shown at 88. The input data for the encoder 86 would be the string comprised of the main data D and the modified error check bits p. The encoder 86 implements any error correction code. This code may or may not be the same as implemented by the encoders 24 and 38 in FIG. 1A. The super channel error check bits P* will be transmitted and/or recorded with the main data D and the modified error check bits p. On the receiver side of the super channel circuitry, the error check bits P* are received and take the form P*', as shown at 90. A decoder 92 in the super channel circuitry takes as its input string the P*' error check bits, the received main data D' and the received, modified error check bits P'. Errors within the range of the error detection capability of the P*' error check bits are then detected and errors within the range of the error correction capability of the P*' error check bits are corrected. The output from the decoder 92 is the string 35 in FIG. 1A. As long as any errors in the transmission process are within the correctability range of the error check bits P*', then the string 35 will be error free.

FIG. 2A shows, in phantom, super channel circuitry which performs the same function in the same manner as the super channel circuitry described in FIG. 1A. The method employed in the super channel circuitry of FIG. 2A also is identical to the method employed in FIG. 1A.

Referring to FIG. 2B, there is shown one trial and error type embodiment for a general alpha embodiment where inverse alpha is undefined or not unique. Only the data evaluation or decoding functions are shown in FIG. 2B which are different from those shown in FIG. 2A all other steps being the same. The data evaluation process of FIG. 2B involves a trial and error decoding operation which calculates the P'' fields using Pd' and each of the members of the class A1 . . . An. The first step in this presyndrome P'' calculation process is the supply of each member of the attribute data class A1 . . . An or each member of the ambiguous subset of the attribute data class for the particular conditions of Pd' and P'. The attribute data class members so supplied are concatenated by a functional unit not shown, i.e., unit 70 in FIG. 2A, with the received data string 64 (not shown). This process is symbolized by the attribute data supply step 66, bus 68 and the resulting string 72. The attribute data supply step can be implemented in serial or parallel or any architecture between these two extremes as discussed above. Further many different alternatives exist for the supply of the attribute data members such as a look up table or a multiplexer or parallel buses each hardwired with the bit or symbol pattern of one of the members of the class of attribute data. If a multiplexer is used for the circuit 66, then it will have one input for each member of the attribute data class, and each input will be hard-wired with the bit pattern of one of the attribute data members in that class.

The plurality of bit patterns 72 are input to an encoder 74 to generate a plurality of presyndromes P''. The encoder 74 implements the same alpha operator as the encoder 56 on the transmitter side. Thus each presyndrome P'' will be the result of one of the members of the class Pa1 . . . Pax . . . Pan operating on the Pd' field through the alpha operator. The presyndrome between Pax and Pd' will be identical to P'. The next step therefore is to test all the presyndromes for identity with the P' field. This function is represented by the identity operator unit 75 which generates a plurality of syndromes each representing the results of the identity test between one of the presyndromes and the P' field as shown at 77. Next, the syndromes are tested to determine which caused P'' equal to P' thereby identifying Pax and Ax. The identity of Pax is output to a functional unit 84 which outputs the corresponding Ax field.

Referring to FIG. 2C, there is shown the differences in the receiver side circuitry from that shown in FIG. 2A for an embodiment where an alpha operator is chosen which has an inverse alpha operator which is defined and unique. For inverse alpha defined and unique, the decoding or data evaluation operation is simply the application of the inverse alpha operation between Pd' and P' to directly derive the identity of Pax thereby directly identifying Ax. This is done in one calculation with no trial and error iterations. In embodiments where the inverse alpha operation is defined and unique, an encoder 65 receives the D' field from the bit string 64 via the data path 67 and generates the error check bit string Pd' using the same error correction code used in encoder 56 on the transmitter side (not shown). The Pd' bit string is then input to an inverse alpha operator 69 which also receives the P' bit string from the bit string 64. The inverse alpha operator 69 outputs the Pax bit string which is sent via data path 71 to the output circuitry 84 which uses Pax to output the corresponding attribute data Ax.

Embodiments of the invention can be arranged to implement data handling and data evaluations in either a serial or parallel architecture, or a combination of the two architectures. The process of trial and error iterations using the members of the class A1 . . . An or Pa1 . . . Pan to determine the identity of Pax and Ax is the process of data evaluation or decoding as those terms are used herein. The process of handling the individual bits or symbols in any of the functional units in any of the embodiments on either the transmitter side or the receiver side to do any of the functions specified in any of the embodiments identified herein will be referred to as data handling. A degree of parallelism from one bit to a group of multiple bit words can be selected for the architecture, and the degree of parallelism can be different at different locations within the data transmission system. The most suitable degree of parallelism depends upon a number of factors, such as circuit complexity, data processing time, cost and the like. Data handling and data evaluation of different or of the same architectures can be combined anywhere in any of the embodiments. For example, distribution of data over a plurality of parallel paths and execution of data evaluations to determine the identity of Ax by serial architecture data handling units in each data path is only one of the many possible permutations. Combination of a parallel data handling architecture with a serial data evaluation architecture is also possible. If a parallel data evaluation architecture is included in the combination, a plurality of data handling units to make the evaluation in each data path are necessary. Each of these may be of either a serial or a parallel architecture. Of course data evaluation is necessary only in trial and error embodiments. However, the functional units of any of the embodiments not using the trial and error evaluation may also be either serial or parallel in architecture to do the data handling called for by the particular function to be performed. For trial and error identity testing embodiments of serial architectures, the calculation for each attribute data member will be performed serially. In parallel architecture trial and error embodiments, a syndrome is calculated for each member of the attribute data class concurrently in parallel paths where there is one path for each attribute data member. In a serial architecture, only one path may be used where the single path is used to calculate the syndrome for the first member of the attribute data class, and then it is used again to calculate the syndrome for the second member of the attribute data class.

Figure 3A:
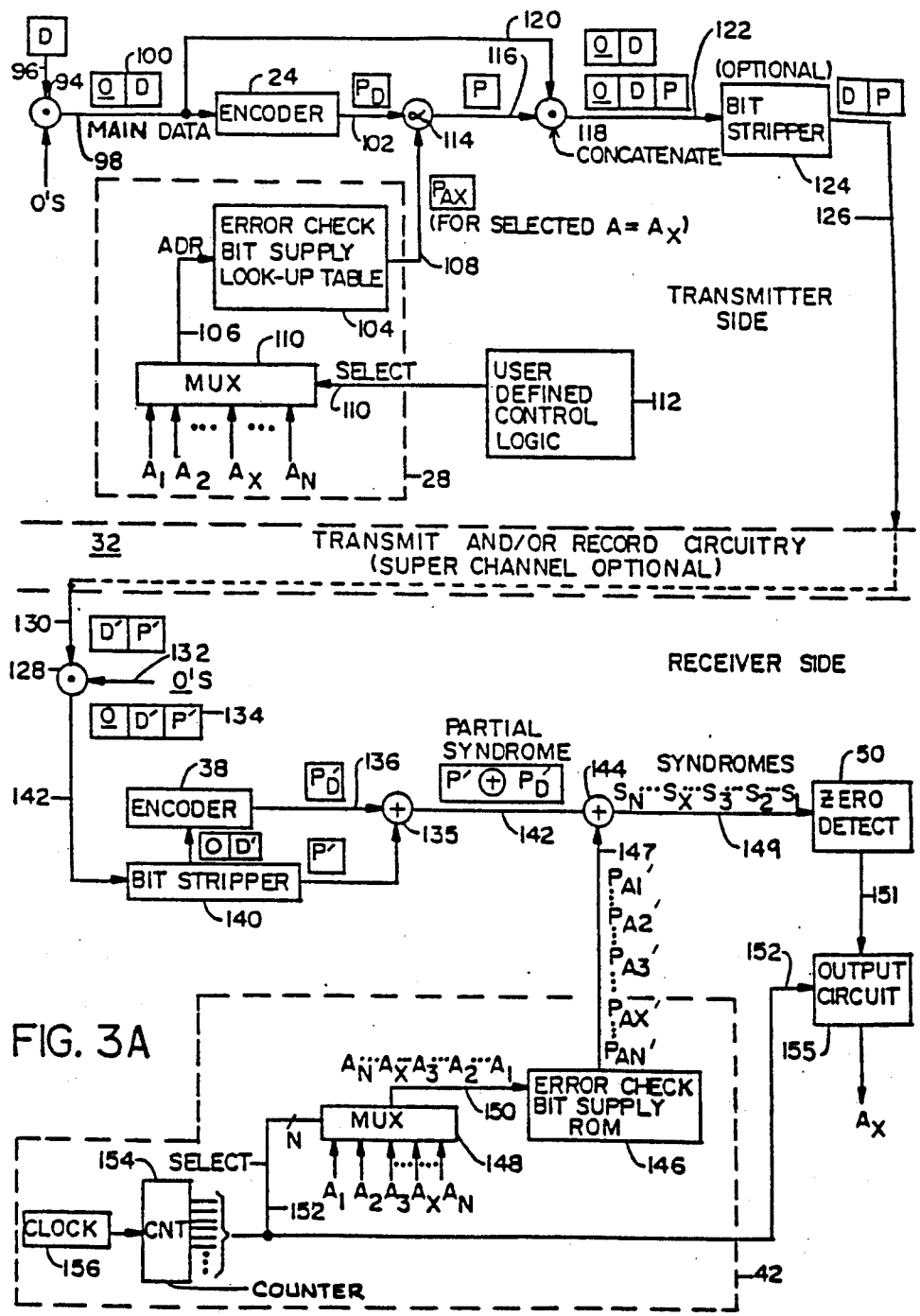
FIG. 3A shows an embodiment of the decomposed method having serial data evaluation architecture on the receiver side.

Referring to FIG. 3A there is shown a serial data evaluation architecture for one embodiment of an apparatus to implement the decomposed method of FIG. 1A where the alpha operator is the exclusive-or logical operation. The transmitter side circuitry is shown on the top half of the figure. There, a concatenator 94 adds a string of zeros to the main data stream arriving at the concatenator input on line 96 from the user. The concatenator 94 can be any design which can add a sufficient amount of leading zeros to the main data string to fill the unused bit positions to make up one word. The term "bits" is used herein for convenience, but should be understood as referring to "symbols" for embodiments of the invention implemented using other than digital binary code. The design of FIG. 3A is only one of many ways of implementing the method of FIG. 1A, and the exact configuration of the circuitry used to implement the method is not critical to the invention. Those skilled in the art will appreciate many variations which may be made to derive alternative embodiments which perform the same functions as the circuitry of FIG. 3A. It is only important that the functions implemented by the circuitry of FIG. 3A be provided such that the various steps of the decomposed method are performed within whatever time or other system constraints are established by the user. Some but not all of these possible alternative embodiments will be described herein.

The concatenator 94 can take many different forms. Since the number of main data bits will be known for every input string to the encoders of the system, the concatenator 94 may simply be circuitry which counts the main data bits arriving on the line 96 and begins filling the bit positions (or time slots) on the main data input line 98 with zeros after the most significant main data bit arrives at the concatenator 94 and is output on the line 98. The concatenated bit string which will be input to the encoder 24 is shown at 100.

The structure of the encoder 24 is well known to those skilled in the art, and is totally dependent on the particular error correction code which is selected by the user for use in implementing the method of FIG. 1A. There are known structures for encoders which can accept input data in either serial or parallel format. In the embodiment of FIG. 3A, the encoder 24 accepts the main data on the line 98 in serial format, and translates the main data into the corresponding main data error check bits Pd, which are then output in serial format on line 102.

These main data error check bits $P_D$ must be encoded with the error check bits Pax corresponding to the attribute data which is selected by the user. Ax is selected from a class of attribute data values A1 through An.

The attribute error check bits Pax for the selected attribute data Ax are supplied by the attribute error check bit supply circuit 28. This circuit can take many forms. In the preferred embodiment, a look-up table 104 is used to store the attribute error check bits Pa for each of the members of the class of attribute data. These bits pa may be the result of a calculation using the same or a different error correction code from the error correction code which was used to calculate the Pd bits. Typically, these bits Pa would be stored in a read-only memory. To access a particular set of said attribute error check bits, the address would be supplied to the look-up table on a bus 106. Said address would correspond to the location in which was stored the error check bits for a particular member of the class of attribute data. Upon receiving this address, the look-up table 104 would output the corresponding bits Pax for the selected attribute data on a bus 108.

The addresses on bus 106 could be supplied in any one of a number of ways. In the embodiment shown in FIG. 3, a multiplexer 110 is provided with its output coupled to the bus 106 and a plurality of inputs. Each input would be coupled to a hard-wired bit pattern for the address of the attribute error check bits for a particular one of the members of the attribute data class. A select signal on a bus 110 from user-defined control logic 112 would control the selection by the multiplexer 110 of the particular one of its inputs which is coupled at any particular time to the output bus 106.

In an alternative embodiment, the error check bit supply circuit 28 would consist simply of a multiplexer like the multiplexer 110. In this alternative embodiment, each input corresponding to a member of the attribute data class would be hard wired with the bit pattern for the particular attribute error check bits Pa corresponding to that member of the attribute data class. The select signal 110 would then cause the selected one of the attribute data class error check bit patterns to be coupled onto the bus 106. The bus 106 would then be coupled to the alpha operator circuitry 114.

The alpha operator selected may be any alpha operator, and the receiver side circuitry will depend upon the alpha operator selected. In the preferred embodiment, the alpha operator is an exclusive-or circuit.

In an alternative embodiment, the attribute error check bit supply circuit 28 would have an encoder such as the encoder 24 substituted for the look-up table 104. In this embodiment the multiplexer 110 would have its input coupled to the actual bit patterns of the attribute data class members. The select signal 110 would then select one attribute data member for application via the bus 106 to the input of the encoder. The encoder would then calculate the corresponding attribute error check bits Pax for the selected attribute data member, and apply these error check bits to the bus 108 as an input to the exclusive-or circuit 114.

Regardless of the particular configuration of the attribute error check bit circuit 28, the alpha operator 114 encodes the error check bits pd for the main data with the attribute error check bits Pax for the selected member of the attribute data class. This encoding is performed in the preferred embodiment by doing a bit-for-bit exclusive-or logical operation between the Pd and Pax error check bits. The result of this logical operation would be the modified error check bits P on the bus 116.

In alternative embodiments, other apparatus to perform the alpha operator function may be substituted for the circuit 114. In such embodiments, the circuit 114 would be an arithmetic logic unit or some other logic programmed or controlled to perform the same operation on each set of main data error check bits using the appropriate, selected attribute data error check bits.

These modified error check bits must be concatenated with the main data string D for transmission. This is the function of the concatenator 118. This circuit 118 is not necessary if the encoder 24 is of such a design that the output bit string on bus 102 is comprised of the concatenated string of D followed by the corresponding error check bits Pd in the trailing or least significant bit positions. If the concatenator 118 is used, the concatenated string of the main data D, led by a string of zeros in the most significant unused bit positions, enters the concatenator 118 on bus 120. For a serial architecture, the concatenator 118 would be the same design as the concatenator 94, in that the exact number of bits in the modified error a check bit string P would be known, as would the exact number of bits in the string entering on bus 120. This fact would be used to control switching by the concatenator 118. The concatenator 118 functions to first output the bit string P from bus 116 on bus 122. As the modified error check bits P are output on bus 122, they are counted. When the count reaches the specified number of error check bits, the concatenator 118 switches states. The switch of states is from the state where input bus 116 is connected to the output bus 122 to a state where the input bus 120 is connected to the output bus 122, thereby outputting the string on bus 120 immediately following the output of the modified error check bit string P.

Only the main data D and the modified error check bits P are transmitted over the transmit link 32. An optional bit stripper 124 serves to strip the zeros from the bit string on the bus 122 to output the string to be transmitted on a bus 126. The bit stripper 124 can be any design which counts the bits in the input string on bus 122 and cuts off transmission through the bit stripper from the bus 122 to the bus 126 after the number of bits equaling the number of bits in the D and P fields have passed through the bit stripper. Those skilled in the art will appreciate that some header or start-bit and stop-bit information may be necessary to delimit or otherwise signal the start and end of the string to be transmitted on the bus 126. Further, start and stop bits or delimiter characters may also be present to signal the start and end of each main data string. Whether or not these delimiters are used depends on the user's application, and their use is not critical to the invention. Further, the use of the bit stripper 124 is not critical to the invention. The transmission of the leading zeros, along with the main data D and the modified error check bits P over the link 32 will not cause any disruption of the operation of the system. However, stripping the leading zeros from the data to be transmitted is desirable, since transmission of these bits would unnecessarily consume valuable bandwidth.

On the receiver side, the received main data D' and the received modified error check bits P' are input to a concatenator 128 on a bus 130. The concatenator 128 also receives a string of zeros on a bus 132, and serves to reinject the leading zeros in the unused bit positions left open by the shortened main data D'. Although this may be desirable for certain structures of encoders, it is not necessary in some embodiments as mentioned previously. Adding the leading zeros may be necessary in some embodiments with certain encoder structures since encoders such as the encoder 24 and the encoder 38 are designed in the prior art to accept input strings of a fixed length generally equal to the word length of the system in which they are used. If an input code word is shorter than the fixed length, then the unused bit positions should be tied to a logic zero to prevent unknown voltages at floating inputs. Such floating inputs could render the calculated error check bits unreliable. If the bit stripper 124 is not used on the transmitter side, then the concatenator 128 may be eliminated.

The output bit string from the concatenator 128 is shown at 134. This string is input to a bit stripper 140 which separates the O-D' string from the P' string and outputs each string on a different bus. The O-D' string is input to an encoder 38. The encoder 38 implements the same error correction code as the encoder 24 on the transmitter side, and performs the same function in that it calculates Pd' from D'. If there are no errors during the transmission and/or recording of the main data D, or if a super channel was used for the transmission link 32 then D' will equal D and Pd' will equal Pd.

In the embodiment of FIG. 3A using exclusive-or as the alpha operator, the operator 135 is an exclusive-or circuit which generates a partial syndrome P' X-OR Pd' on the bus 142.

In the preferred embodiment, the partial syndrome output by the exclusive-or circuit 135 must be subjected to an exclusive-or operation with each of the attribute error check bit strings Pa1' through Pan' corresponding to the attribute data class members A1 through An. The order in which the bit strings P', Pd' and Pa1' . . . Pan' are exclusive-ored is not critical to the invention, and in some embodiments the order (P' X-OR Pd') X-OR Pa1' . . . Pan' may be switched around to other permutations.

To accomplish the exclusive-or operation in the order shown in FIG. 1A, the partial syndrome on the output bus 142 from the exclusive-or circuit 135 is coupled to the input of another exclusive-or circuit 144. The exclusive-or circuit 144 has another input bus 147 which carries a stream of attribute error check bit strings Pa1' through Pan'. This stream of bit strings is supplied by the attribute error check bit supply circuit 42. As in the case of the attribute error check bit supply circuit 28 on the transmitter side, the attribute error check bit supply circuit 42 on the receiver side may be implemented in any one of a number of different ways. In the preferred embodiment, an attribute error check bit supply ROM 146 is used to store the attribute error check bit strings Pa1 through Pan corresponding to individual members of the attribute data class. The addresses for the ROM 146 are supplied on a bus 150 from the output of a multiplexer 148. The multiplexer 148 has a plurality of inputs wherein each input is hard wired with the address of a specific one of the members of the attribute data class. A select signal on a bus 152 sequentially causes the multiplexer 148 to select each one of its inputs for coupling to its output bus 150. The result is a stream of address strings on the bus 150 to the address port of the attribute error check bit supply ROM 146. Those skilled in the art will appreciate the other control signals which must be supplied to the ROM 146 (and 104) to cause it to correctly access the data corresponding to each arriving address string. The design for such circuitry will be apparent to those skilled in the art.

The select signal on the bus 152 may be generated in any one of a number of different ways. The exact manner in which it is generated is not critical to the invention. One way of generating a select signal which causes sequential coupling by the multiplexer 148 of each of its inputs bus 150 to its output is through use of a counter 154 having its count input driven by a clock 156. The counter 154 converts the stream of binary clock pulses from the clock 156 into sequential activations of each of a plurality of outputs where each of its outputs comprises one line in the bus 152. As each output lines of the counter 154 is activated, the multiplexer selects a corresponding one of its inputs for coupling to its output bus 150. The frequency of the clock 156 must be set such that the select signal on the bus 152 causes each address to be output on the output bus 150 for a sufficiently long time to allow the ROM 146 to access the corresponding attribute error check bits and output them on the bus 147.

Those skilled in the art will appreciate many other ways of supplying the attribute error check bits Pa1' through Pan'. One such way would be to dispense with the ROM 146 and to hardwire the inputs of the multiplexer 148 such that each input is coupled to a hardwired bit pattern corresponding to the attribute error check bits of a particular one of the class of attribute data members. The bus 150 is then connected directly to the input of the exclusive-or or other decoding circuit 144. This method is faster than the use of the attribute error check bit supply ROM 146, and is the preferred embodiment of the attribute error check bit supply circuit 42.

Another way of implementing the circuit 42 is to dispense with the ROM 146 and to substitute an encoder such as the encoders 24 and 38. The inputs of the multiplexer 148 would then be hardwired to the bit patterns of the individual members of the attribute data class themselves. A select signal 152 then causes each individual member of the attribute data class to be input via the bus 150 to this encoder. The encoder calculates the corresponding attribute error check bits for each attribute data class member arriving at its input and outputs a stream of attribute error check bit strings Pal' through Pan' on the bus 147.

Regardless of the manner in which the stream of attribute error check bit strings Pal through Pan are supplied on the bus 146, the exclusive-or or other decoding circuit 144 always functions in the same way. The purpose of the exclusive-or circuit 144 is to generate the final syndromes Sl through Sn which are used to determine which member of the attribute data class was encoded in the modified attribute error check bits P on the transmitter side. The exclusive-or circuit 144 outputs the stream of syndromes on a bus 149. Each of the syndromes Al through Sn is calculated by performing a bit-for-bit exclusive-or operation between one of the error check bit strings Pal' . . . Pan' and the partial syndrome on bus 142. It will be apparent to those skilled in the art that the number of bits in the partial syndrome on the bus 142 is equal to the number of bits in the bit strings Pd' and P', since a bit-for-bit exclusive-or operation was used to generate the partial syndrome, and since there are no carries in the exclusive-or logical operation. Further, the number of bits in each of the error check bit strings Pal' through Pan' is also equal to the number of attribute error check bits in the partial syndrome in bus 142. Each syndrome should then consist of the number of bits corresponding to the number of bits in the partial syndrome. The only syndrome in the stream of syndromes on the bus 149, which is all zeros, will be the syndrome corresponding to the attribute error check bits Pax'. The reason for this is that (P' X-OR Pd') X-OR Pax' is equal to P' X-OR (Pd' X-OR Pax') which is equal to P' X-OR P if there were no errors in transmission. If there were no errors, P'=P, and P' X-OR P=zero. Since Pax' corresponds to the selected member Ax of the attribute data class which was encoded by the transmitter side circuitry, the identity of Ax is thus revealed.

The stream of syndromes on the bus 149 are coupled to a zero detector 50 which causes a signal on a bus 151 to change states when an all-zero syndrome is detected. The zero-detect circuit 50 can be a simple NOR (or NAND) gate connected to the outputs of a serial-in parallel-out shift register. This shift register shifts in the serial format bits of each syndrome until all bits have arrived and then outputs all bits of the syndrome simultaneously in parallel format to the inputs of a NOR gate. If the inputs to the NOR gate are all zeros, the NOR gate output would change states.

An output circuit 155 then outputs the selected attribute data member Ax when the change of states on the bus 151 occurs. The function of the output circuit 155 may be performed by any one of a number of different designs which will be apparent to those skilled in the art. Output circuit 155 has as an input, the select circuit on the bus 152, by which it keeps track of the sequence in which the members of the attribute data class have their attribute error check bits supplied to the exclusive-or circuit 144. By knowing this information, it is possible for the output circuit to know the sequence of the syndromes Sl through Sn arriving on bus 149 to which member of the attribute data class each syndrome corresponds. The output circuit 155 could be a look-up table similar in design to the attribute error check bit supply circuit 42, except that the ROM in the output circuit would contain the attribute data member bit patterns themselves rather than the attribute error check bits corresponding thereto. The output on the bus 151 of the zero-detect circuit could be used to gate the select signal on the bus 152 into the output circuit 155 such that only the select signal corresponding to the syndrome which was all zeros would actually cause the output circuit 155 to retrieve an attribute data member from its ROM. Similar variations in the design of the output circuit 155 may be made, as were described earlier herein with respect to the attribute error check bit supply circuit 42.

Figure 3B:
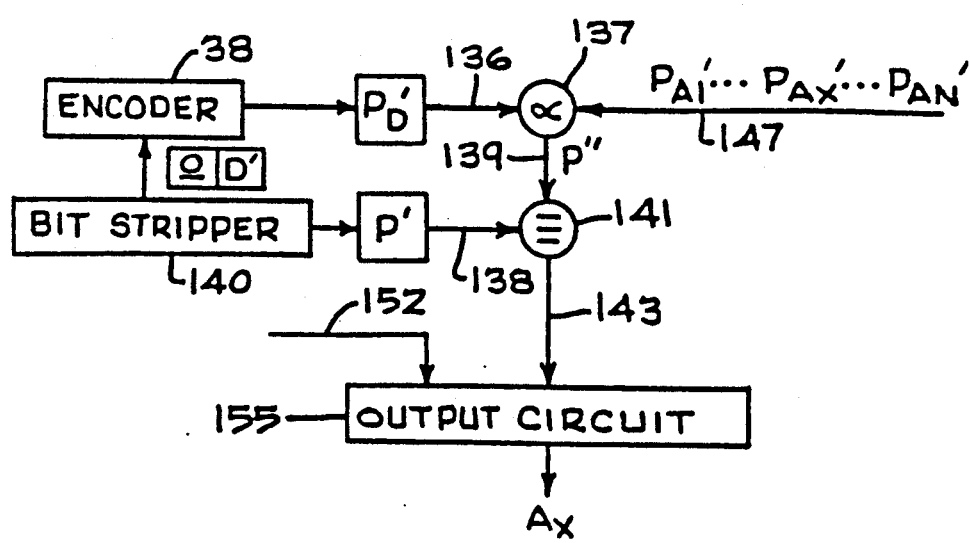
FIG. 3B is a conceptual flow diagram of the changes to the embodiment of FIG. 3A on the receiver side where the alpha operator is selected such that the inverse alpha operator is not defined or not unique.

Referring to FIG. 3B, there is shown an embodiment where the alpha operator is any general alpha operator which is not defined or not unique where the decomposed method with serial data evaluation is used. In this embodiment, the Pd' string on bus 136 is applied to an alpha operator circuit 137 which receives as another input the stream of attribute error check bits Pa' in the class Pal' . . . Pan' on the bus 147. The alpha operator outputs a series of P'' fields on a bus 139 which is coupled to an identity operator 141. The identity operator also receives as an input the P' bit string via the bus 138 and does a comparison between P' and each P'' to determine if the two bit strings are identical. When an identity is found, data regarding the decoded identity of Pax' is sent via bus 143 to the output circuit 154 to cause the corresponding attribute data Ax to be output.

Figure 3C:
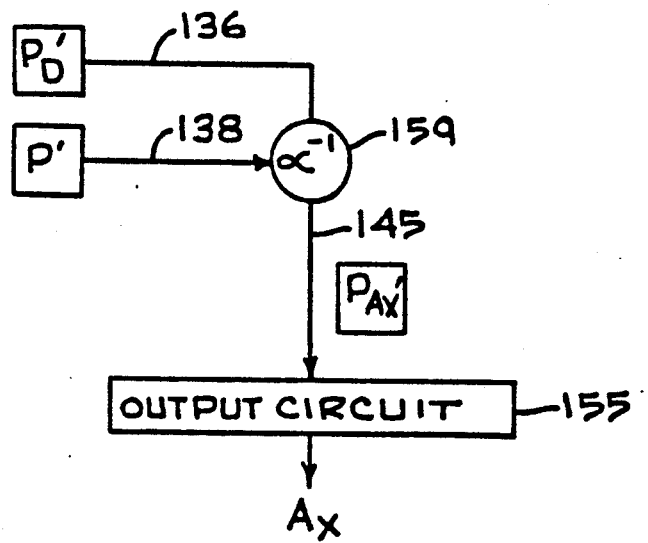
FIG. 3C is a conceptual flow diagram of the changes to the embodiment of FIG. 3A on the receiver side where the alpha operator is selected such that the inverse alpha operator is defined and unique.

FIG. 3C shows an embodiment of the decomposed method where inverse alpha is defined and unique, and shows the changes to the receiver side circuitry from that shown in FIG. 3A. In this embodiment, the Pd' field on bus 136 and the P' field on bus 138 are applied to the inverse alpha operator 159. The output of the inverse alpha operator circuit 159 will be the Pax' string on bus 145. This string will be sent to the output circuit 155 which, in turn, will decode that string into the corresponding attribute data Ax.

Figure 4A:
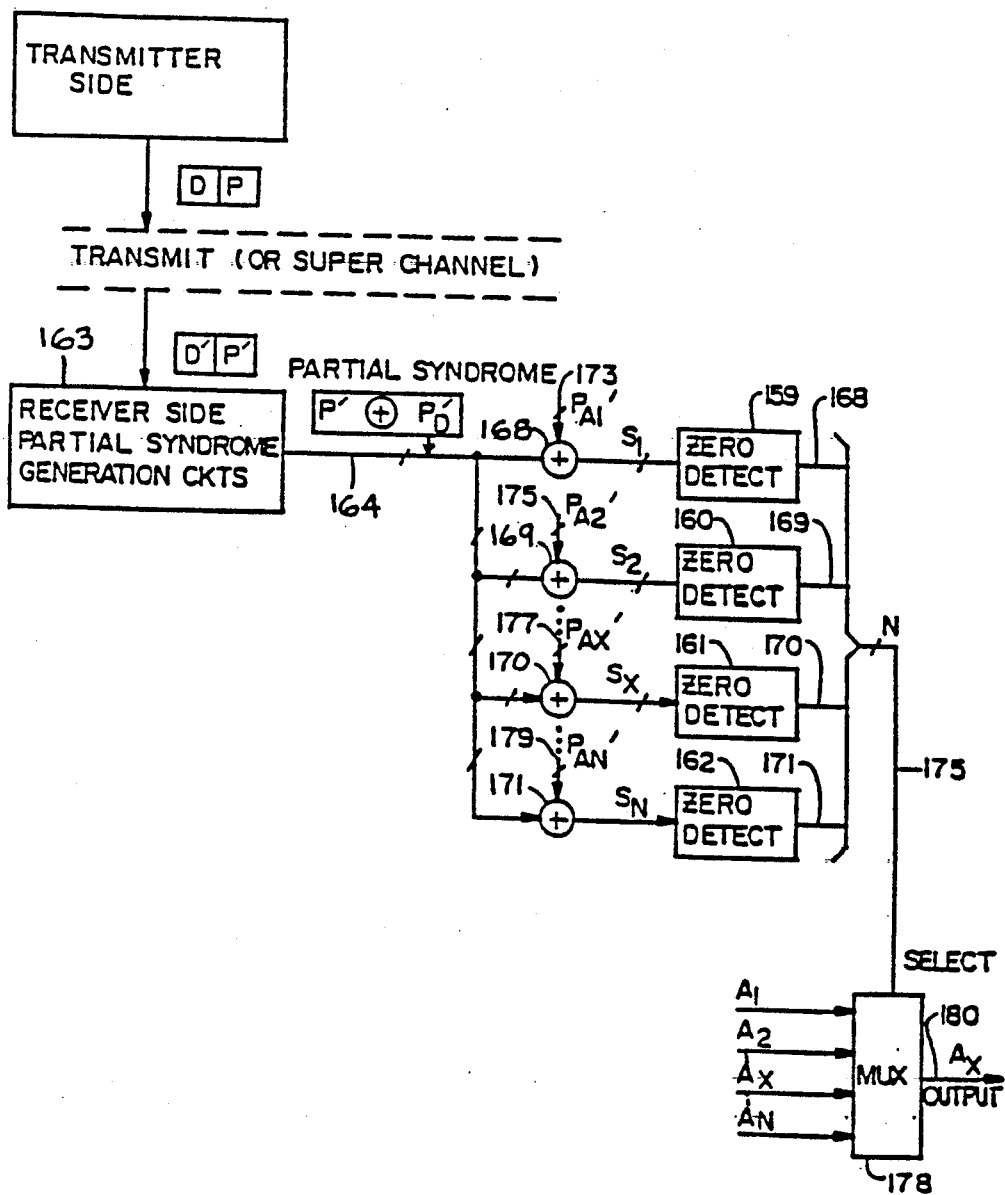
FIG. 4A is parallel data evaluation architecture machine for practicing the decomposed method of the invention where alpha is selected to be the exclusive-or logical function.

Referring to FIG. 4A, there is shown an embodiment of apparatus arranged to implement the decomposed method of the invention using a parallel data evaluation architecture for the alpha operator as the exclusive-or logic operation. The embodiment of FIG. 4A is the preferred apparatus to practice the preferred method of the invention. The circuitry on the transmitter side may be identical, as in the embodiment shown in FIG. 3A. Alternatively, it may perform the same functions as the apparatus of FIG. 3A, but perform them in parallel fashion. Any number system and any error correction code can be used and any alpha operator may be selected. The circuitry on the receiver side of this embodiment will, as in the case of the embodiment of FIG. 3A, have to be selected in accordance with whether the inverse alpha operator is or is not defined and unique.

Similar comments apply to the receiver side partial syndrome generation circuits in FIG. 4A. That is, in making the identity testing circuitry of the embodiment of FIG. 3A into the parallel format embodiment of FIG. 4A, the circuitry preceding and following the identity test circuitry may be identical, as in the embodiment shown in FIG. 3A, or it may be arranged to perform the same functions as the embodiment of FIG. 3A, but in a parallel fashion. Furthermore, the encoder (not shown) in the circuitry 163 will generate Pd' using the same error correction code used to generate Pd on the transmitter side and will process Pd' with P' to generate at Pax'. Pax' is then output on bus 164 to output circuit 166 which converts Pax' to its corresponding attribute data in any known fashion.

For trial and error embodiments using the exclusive-or logic operation for the alpha operator such as shown in FIG. 4A, the decoder circuitry 163 generates a partial syndrome comprised of P' X-OR Pd' on the bus 164. The partial syndrome generated on bus 164 is then combined simultaneously in a plurality of X-OR circuits 168, 169, 170, 171 ... etc. with one member of the class Pal' ... Pan' each member of said class being coupled to an input of the corresponding exclusive-or (X-OR) operator circuit. The output of the X-OR circuits 168–171 are the syndromes which collectively identify the attribute data encoded on the transmitter side by the particular syndrome which is all zeros.

More precisely, for the trial and error embodiment with the alpha operator selected as an exclusive-or logic operation, a single partial syndrome will be output on the bus 164 of FIG. 4A, and will be coupled to the inputs of a plurality of exclusive-or circuits 168–171. There will be one exclusive-or circuit, such as the exclusive-or circuits 168–171 for each member of the attribute data class. The attribute error check bits corresponding to the individual members of the attribute data class will be supplied on individual buses 173, 175, 177 and 179, with each bus coupled to an input of one of the exclusive-or circuits 168–171. In other words, each exclusive-or circuit 168–171 receives a partial syndrome. Each exclusive-or circuit 168–171 computes a single syndrome and each syndrome corresponds to one member of the attribute data class. Only the syndrome Sx corresponding to the selected member Ax of the attribute data class which was encoded by the transmitter side will be all zeros.

Each syndrome in parallel format is supplied to the input of a zero-detect circuit such as the zero-detect circuits 159–162. Each zero-detect circuit has an output line, shown as lines 168–171 respectively, which carries a signal which changes state when the syndrome at the input is comprised of all zero bits. These output lines 168–171 are collected in a multiline select bus 175, and are coupled to the select port of a multiplexer 178. This multiplexer serves the purpose of the output circuit 154 in FIG. 3A.

The multiplexer 178 has a plurality of inputs with each input being assigned to one particular member of the attribute data class. Each input is hardwired to a bit pattern which represents the corresponding member of the attribute data class. The select signals on the bus 175 are such that only the input corresponding to the syndrome which was all zeros will be selected for output on the output bus 180.

Figure 4B:
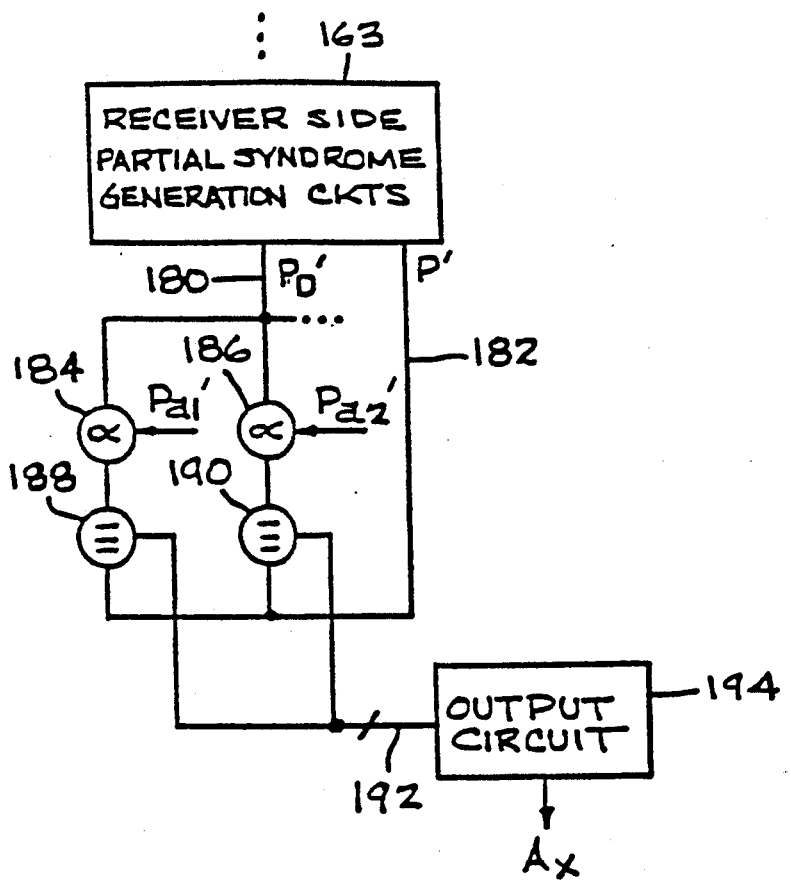
FIG. 4B is a conceptual flow diagram of the changes to the embodiment of FIG. 4A on the receiver side where the alpha operator is selected such that the inverse alpha operator is not defined or not unique.

FIG. 4B shows the changes in the receiver side circuitry from that shown in FIG. 4A for an embodiment of the decomposed method where inverse alpha is not defined or not unique. In this embodiment, the receiver side partial syndrome generation circuitry 163 generates Pd' using the same error correction code used to generate Pd on the transmitter side. Pd' and P' are then output on buses 180 and 182 respectively. Pd' is combined simultaneously in a plurality of alpha operator circuits 184, 186 ... with each member of the class Pal' ... Pan'. The results are then simultaneously compared in a plurality of identity circuits 188, 190 ... etc. to P'. The outputs of the identity circuits collectively identify which of the class Pal' ... Pan' is Pax'. This data is sent on a bus 192 to an output circuit 194 which outputs the attribute data Ax corresponding to Pax'.

Figure 4C:
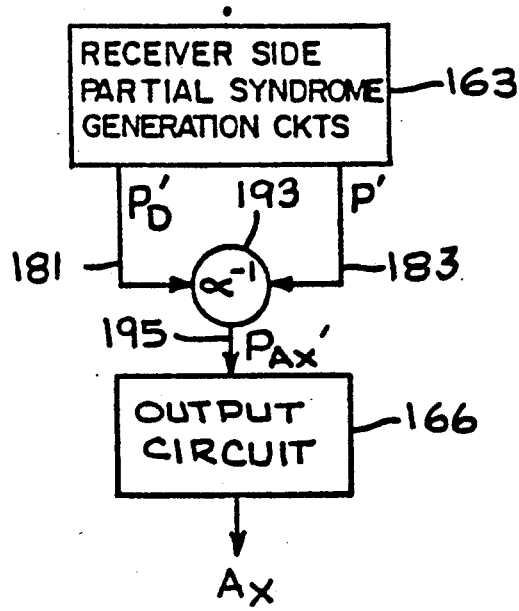
FIG. 4C is a conceptual flow diagram of the changes to the embodiment of FIG. 4A on the receiver side where the alpha operator is selected such that the inverse alpha operator is defined and unique.

Referring to FIG. 4C, there is shown the changes to the receiver side circuitry shown in FIG. 4A for an embodiment of the decomposed method where the inverse alpha operator is defined and unique. In this embodiment, the receiver side partial syndrome generation circuits 163 generate Pd' from the received main data D' using the same error correction code used on the transmitter side. The Pd' field and the P' field on the buses 180 and 182 respectively are applied to an inverse alpha operator 193 which calculates Pax and outputs same on a bus 195. An output circuit 166 receives Pax and outputs the corresponding Ax field.

Figure 5A:
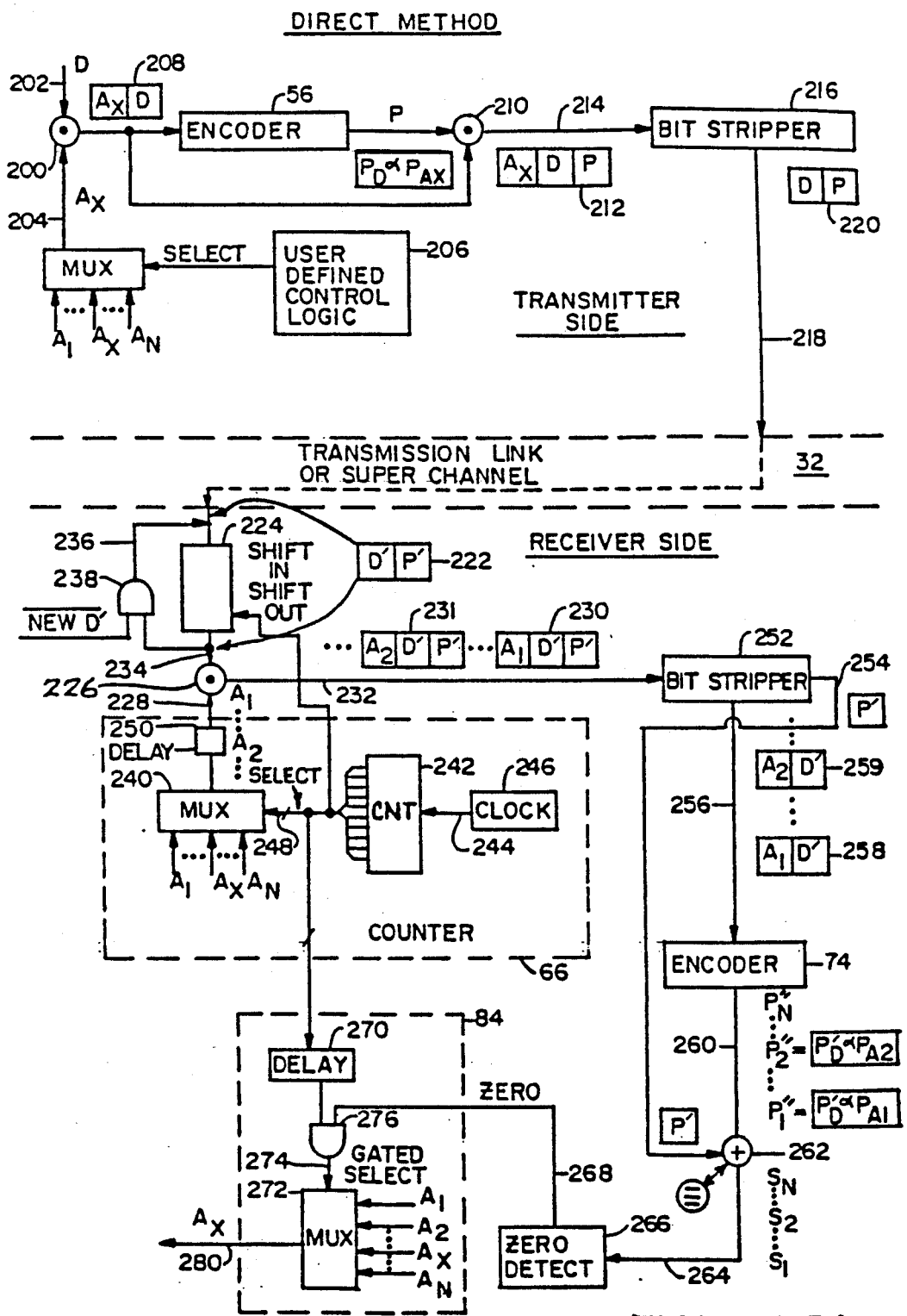
FIG. 5A is a direct method, serial data evaluation architecture machine for practicing the invention where alpha is selected to be any general alpha operator including the exclusive-or logical operation.

Referring to FIG. 5A, there is shown a serial data evaluation architecture for an apparatus to implement the direct method of the invention with alpha not defined or not unique including the case where alpha is the exclusive-or logic operation. In the direct method, a concatenator 200 receives the main data D in a serial bit stream on bus 202 and concatenates D with the selected attribute data Ax arriving in a bit stream on a bus 204. The selected attribute data bit stream may be supplied in any one of a number of different ways as discussed previously with regard to FIG. 3, and the manner in which it is supplied is not critical to the invention. In FIG. 5, the multiplexer method was selected wherein each input of the multiplexer has an input which is hardwired to the bit pattern of one of the members of the attribute data class. User defined control logic 206 causes the selection of the desired member of the attribute data class such that it defines some attribute of the main data D then arriving. The output of the concatenator 200 is a string 208 with the selected attribute data concatenated into the unused bit positions left open by the main data D.

The encoder 56 receives the serial bit stream 208 and translates it into the modified attribute error check bits P in accordance with an error correction code of the user's choice. Although in the preferred embodiment the logical operation exclusive-or is used for the alpha operator, any other alpha operator could also be used. FIG. 5 symbolizes the alpha operation used for the encoding by the Greek letter alpha. Those skilled in the art will appreciate that encoder 56, in the preferred embodiment, simply operates on its input string 208 to translate the string 208 to its corresponding modified attribute error check bits P. That is, the encoder 56 does not separately calculate the error check bits for the attribute data Ax and the main data D and then combine them using an exclusive-or logical operation. However, in alternative embodiments such a method of generation of the modified attribute error check bits could be used. Further, if other mathematical or logical operations were used, such as addition or the logical operation AND, then the encoder 56 could take the form of two prior art encoders to generate the separate check bits Px and Pd for the selected attribute data member and the main data, respectively followed by the circuitry to combine the two strings using the alpha operator. That is, the two attribute error check bit output strings from the separate encoders could be applied to the data inputs of an arithmetic logic unit which could be controlled to add the two strings, subtract the two strings, multiply them, divide them, or perform a logical AND or a logical OR operation between them.

The output from the encoder 56 or arithmetic logic unit is the string of modified attribute error check bits P. The bits P are then applied to one input of a concatenator 210. Another input of the concatenator is coupled to the input of the encoder 56 to receive the bit string 208. The circuit 208 concatenates the modified attribute error check bits P to the string 208 and outputs the string 212 on a bus 214. The bus 214 is connected to the input of a bit stripper 216. This bit stripper 216 performs the same functions as the bit stripper 124 in FIG. 3, except that it is not optional. That is, only the main data D and the modified attribute error check bits P are to be transmitted. These bits must be stripped off from the bit string 212 so that the selected attribute data Ax is not transmitted. To transmit the attribute data Ax would defeat the purpose of the invention, which is to recover the selected attribute data on the receiver side without actually having transmitted it. The bit stripper 216 can have any of the designs described above for the bit stripper 24, and its exact design is not critical to the invention. Those skilled in the art will appreciate that there are many different ways of fabricating such a bit stripper. The output of the bit stripper 216 on a bus 218 is applied to the input of the transmission link 32 and supplies the bit string 220 to said input.

As for the previous embodiments discussed herein, the transmission link 32 may include its own error-checking capabilities. The input code word would be the bit string 220, and the output would be the corrected bit string 222 shown on the receiver side in FIG. 5. The apparatus to do this error detection and correction in the transmission link 32 will be apparent to those skilled in the art.

The received main data D' and the received modified attribute error check bits P' are shifted into a recirculating shift register 224. The purpose of this shift register 224 is to store the received bit strings 222 and shift them out to the input of a concatenator 226 repeatedly for sequential concatenation with each of the bit strings 222 with each of the members of the class of attribute data in trial and error embodiments where the inverse alpha operator is not defined or not unique. These trial and error embodiments will be discussed first.

Because the receiver side circuitry must calculate the attribute error check bits P'' for each of the members of the attribute data class concatenated with D' in the trial and error embodiments (or at least for all members of the attribute data class ambiguous subset which satisfies the condition of Pd' and P'), it is necessary to form a plurality of bit strings comprised of D' concatenated with "each" member of the attribute data class in the unused bit positions as input strings for the circuitry which computes P''. That circuitry is the encoder 74.

To accomplish this multiple concatenation function, the concatenator 226 has supplied to it at another input, a bit stream consisting of the bit strings for each member of the attribute data class. These bit strings arrive sequentially on a bus 228 at an input to the concatenator 226. As each attribute data bit string arrives at the concatenator 226, the shift register 224 shifts out the string 222 in a proper timed relationship to the arrival of the bit string of the attribute data class so as to form one of the bit strings 230, 231, etc. on the bus 232.

Because the received P' and D' bit string 222 must be used once for every member of the attribute data class, the shift register 224 must be recirculating. Thus, when a copy of the bit string 222 is shifted out to the concatenator 226 on the bus 234, a copy of the bit string 222 is also shifted back into the input of the shift register 224 via a bus 236. A gate 238 on the bus 236 allows the bits shifted out of the shift register 224 to be shifted back into the shift register during all times when the P'' attribute error check bits for the string 222 corresponding to a single string of input data D' are being calculated. The state of this gate 238 is controlled by a control signal which is designated herein as the signal "new D'" which is an active low signal which becomes a logic zero when a new bit string 222 is arriving on the transmission link 32.

The attribute data supply circuit 66 in FIG. 2 can be implemented in many different ways, and only one of these possible ways is shown in FIG. 5A. The exact manner in which the attribute data supply circuit 66 is implemented is not critical to the invention, so long as the implementation selected is capable of supplying the bit string defining each of the members of the attribute data class in a stream on the bus 228 to the concatenator 226. The particular implementation selected for the embodiment of FIG. 5A involves a multiplexer 240, which has a plurality of inputs with each input corresponding to one member of the attribute data class. That is, each input is hardwired to the bit pattern of its corresponding member of the attribute data class. A select signal on a bus 248 controls which of the inputs of the multiplexer 240 is coupled to the output bus 228. If the bus 228 is a serial format bus, then the multiplexer 240 must contain a parallel-in, serial-out shift register as its output stage. The select signal on line 248 is supplied as one active signal in a group of output signal lines from a counter 242. The count input of this counter 242 is connected to a clock signal on a line 244 supplied by a clock 246. As the counter 242 counts the clock pulses, the count number represents the particular one of the plurality of outputs connected to the bus 248 carrying the select line which at any particular time is active. As each one of the outputs of the counter 242 becomes sequentially active, a new one of the inputs of the multiplexer 240 is coupled to the output bus 228, thereby supplying the bit pattern of the corresponding member of the attribute data class on the bus 228.

The select signal on the bus 248 is also coupled to the shift register 224 as a control signal to indicate to the shift register when a copy of the bit string 222 should be shifted out to the concatenator 226. Those skilled in the art will appreciate the timing and control circuitry necessary to use the select signal on the bus 248 to cause the shift register 224 to shift out its contents at the proper time. In some embodiments, a delay means 250 on the bus 228 can be used to cause the proper timing relationship between the arrival of the bit string 222 and the arrival of a bit string representing a member of the attribute data class.

Those skilled in the art will appreciate that the particular apparatus shown in FIG. 5A on the receiver side to cause the concatenated strings 230, 231 etc. for each member of the attribute data class to occur is not critical to the invention. Any serial format architecture which can cause the concatenated strings 230, 231 etc. to be formed will suffice for purposes of practicing the invention.

The concatenated strings 230, 231 etc. are applied to the input of a bit stripper 252. The purpose of this bit stripper 252 is to separate out the received attribute error check bits P', and to output them on a bus 254. The bit stripper 252 also separates out the concatenated strings comprised of the received main data D' concatenated with each member of the attribute data class and outputs these bit strings in a stream on a bus 256. The bit strings so separated are shown at 258. 259 etc.

Each of the bit strings 258. 259 etc. are applied to the input of an encoder 74. The purpose of the encoder 74 is to generate the P" attribute error check bits for each of the bit strings 258, 259 etc. The encoder 74 implements the same error correction code implemented by the transmitter side encoder 56, and may be of the same design. In the preferred embodiment, the encoder 74 is identical to the encoder 56, and implements the same alpha operator between the attribute error check bits Pd' for the received data D' and the attribute error check bits, Pa1, Pa2, etc., for the corresponding members of the attribute data class. This alpha operator or sequence of mathematical and/or logical operations is symbolized by using the Greek letter alpha. FIG. 5A is intended to to illustrate the circuitry of both the cases where alpha is any general alpha or where alpha is the exclusive-or logical operation. The alpha operator represents the mathematical and/or logical operation or sequence of operations by which the attribute error check bits Pd' for the received data D' are encoded with the error check bits Pal, Pa2, etc. for the individual members of the attribute data class. In alternative embodiments, the encoder 74 may be any other structure which will generate the bits P" such that for $A=Ax$ and $D=D'$, P" will equal p regardless of whether the same mathematical or logical operations are used as were used by the encoder 56 on the transmitter side.

The output of the encoder 74 is a stream of bit strings P1", P2" . . . Pn" on the bus 260. Each bit string in the stream represents one P" attribute error check bit string corresponding to the encoding of the error check bits Pa for one member of the attribute data class into the attribute error check bits Pd' for the received data D'.

The bus 260 is coupled to one input of an syndrome generation circuit 262. The other input of the syndrome generation 262 is coupled to the bus 254 and receives the bit strings of the received modified error check bits P'. The syndrome generation circuit 262 functions to determine if P" and P' are identical. In the preferred embodiment, the identity checking circuit 262 is an exclusive-or circuit, but in alternative embodiments, any structure that can determine equality between P" and P' will suffice for practicing the invention.

Only one of the syndromes on the bus 264 will be all zeros. This syndrome will correspond to the P" in which is encoded the attribute error check bits Pax corresponding to the selected member Ax of the attribute data class which was encoded on the transmitter side.

The syndrome bit stream on bus 264 will be coupled to the input of a zero-detect circuit 266, which has the same design as the zero-detect circuit 50 in FIG. 3A. Its output signal ZERO on a line 268 will be coupled to the output circuit 84. This output circuit 84 serves to output the particular member of the attribute data class which corresponds to the syndrome on the bus 264 which was all zeros. To accomplish this function, the output circuit 84 is coupled to the select signal on the bus 248 through a delay circuit 270 the purpose of which will be explained below. The heart of the output circuit 84 is a multiplexer 272 which has one input corresponding to each member of the attribute data class. Each input is hardwired to the bit pattern of the corresponding member of the attribute data class. The multiplexer 272 receives a gated select signal on a bus 274 which represents the select signal on the bus 248 delayed in time and gated through an AND gate 276 by the ZERO signal on the line 268. The ZERO signal on the line 268 will remain in a logic zero state for non-zero syndromes, thereby blocking the select signals on the bus 248 from reaching the select input of the multiplexer 272 as each syndrome on the line 264 arrives. When the particular syndrome corresponding to the selected member Ax of the attribute data class arrives and is processed by the zero-detect circuit 266 the logic state of the ZERO signal on line 268 changes to a logic one. This causes the AND gate 276 to gate the select signal then on the bus 248 through to the select input of the multiplexer 272. The delay circuit 270 serves to delay the select signal for a sufficient time to account for the delays in having the bit strings 230, 232 etc. pass through the encoder 74 and converted to the P" attribute error check bit strings. The delay circuit 270 should impose a sufficient delay such that the gated select signal on the line 274 selects the proper selected member Ax of the attribute data class for output on the output bus 280 at the same time that the syndrome corresponding to Ax arrives at the zero-detect circuit 266 and causes the change of state of the ZERO signal on line 268.

Those skilled in the art will appreciate that the output circuit 84 may be implemented in any one of a number of different ways, and the particular implementation shown in FIG. 5A is not critical to the invention. It is only necessary that the implementation selected be able to output the proper selected member of the attribute data class corresponding to an all-zero syndrome being generated by the exclusive-or circuit 262.

Figure 5B:
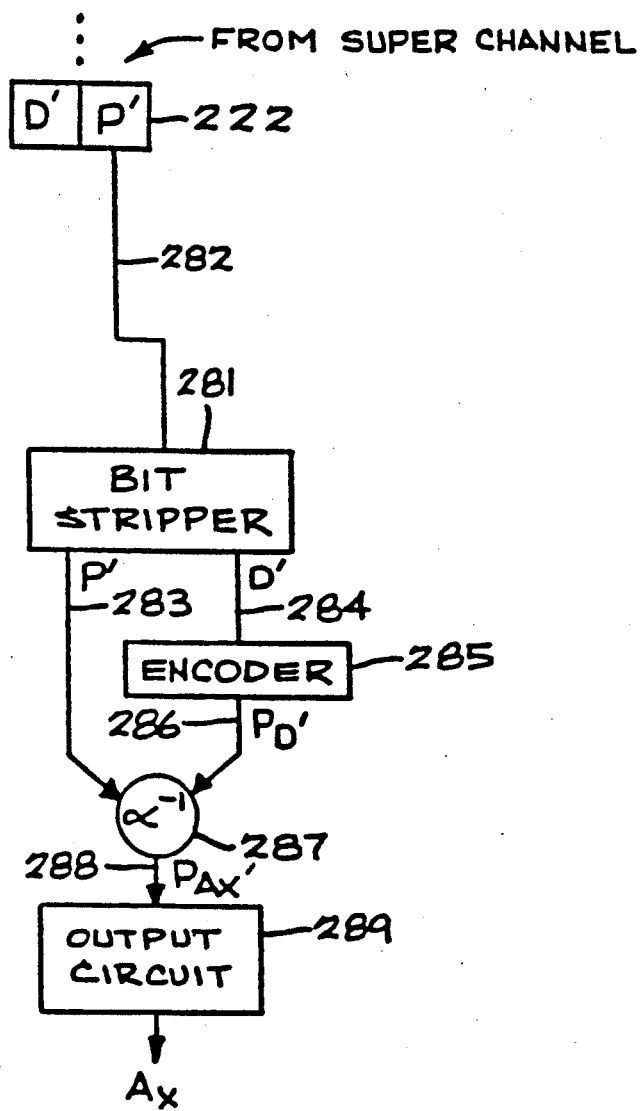
FIG. 5B is a conceptual flow diagram of the changes to the embodiment of FIG. 5A on the receiver side where the alpha operator is selected such that the inverse alpha operator is defined and unique.

Referring to FIG. 5B, there is shown an embodiment of the invention where the alpha operator implemented by the encoder 56 has a defined and unique inverse alpha operator. FIG. 5B shows only the differences in the receiver side circuitry from that shown in FIG. 5A. As is readily seen, in all embodiments where inverse alpha is defined and unique, the receiver side circuitry is much simpler. In the embodiment shown in FIG. 5B, the incoming bit string 222 from the transmission link is applied to a bit stripper 281 via a bus 282. The bit stripper 281 functions to strip the P' and D' bits and output them separately on the buses 283 and 284 respectively. An encoder 285 receives the D' bit string on the bus 284 and generates the attribute error check bits Pd' on a bus 286. The encoder 285 implements the same error correction code as was implemented by the encoder 56 on the transmitter side (not shown). The attribute error check bit strings Pd' and P' are then applied to an inverse alpha operator circuit 287 which reverses the alpha operator encoding operation performed by the encoder 56 (not shown) to generate the Pax attribute error check bit string on a bus 288. This data is coupled to an output circuit 289 which outputs the corresponding attribute data Ax.

Figure 6A:
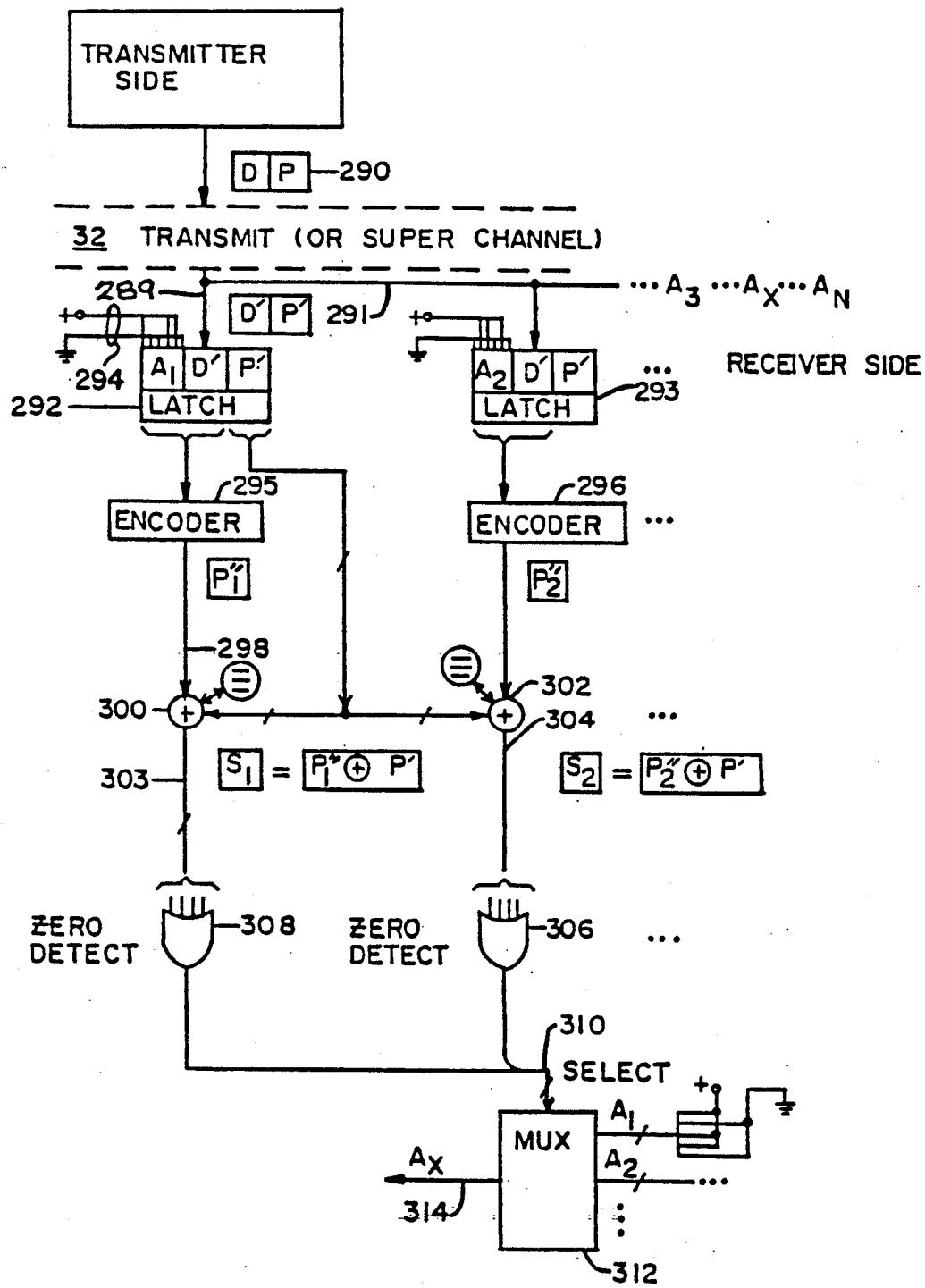
FIG. 6A is a parallel data evaluation architecture machine for practicing the direct method of the invention where alpha is selected to be any general alpha operator including the exclusive-or logical operation where the inverse alpha operator is not defined or not unique.

Referring to FIG. 6A, there is shown the parallel data evaluation architecture to implement the direct method of the invention using an alpha operator where inverse alpha is not defined or not unique. The embodiment of FIG. 6A represents the situation where alpha is any general or unrestricted alpha operator or the exclusive-or logical alpha operator. In both cases inverse alpha is not defined or not unique. On the transmitter side, there is very little change from the embodiment of the serial architecture shown in FIG. 5A unless parallel format data handling for the encoding of Ax or Pax into the p check bits is desired to speed up operations. That is, the main data D would be processed in parallel format and the selected member Ax of the attribute data class would be input in parallel format for concatenation simply by connecting the lines carrying the selected member Ax of the attribute data class to the unused bit positions at the input of the encoder 56 left open by the foreshortened main data D. The encoder 56 would accept its input string in parallel format and output its modified attribute error check bits P in parallel format using any error correction code and any alpha operator. The bit stripper 216 (not shown) would be a simple design apparent to those skilled in the art. Since these changes are so trivial on the transmitter side, they have not been detailed in FIG. 6A, as they will be apparent to those skilled in the art.

The transmitter side supplies a parallel format string 290 to the transmit link 32 for transmission. As in the other embodiments, the string to be transmitted includes only the main data D and the modified error check bits P. The transmit link may or may not have its own error correction circuitry as in the other embodiments.

On the receiver side, the received main data D' and the received modified attribute error check bits P' are latched in parallel format into a plurality of latches 292, 293 etc. That is, the input bus 289 from the transmit link carrying the D' and P' fields is connected (in parallel or serial format) to the inputs of a plurality of latches 292, 293 etc. such that each latch receives a copy of the main data D' and the modified attribute error check bits P'. Each latch is one word in length, and the main data field D' concatenated with the modified error check bit field P' does not consume all the bit positions of each latch. The unused bit positions of each latch have their inputs coupled to a one of a plurality of hard-wired bit patterns each of, which represents one of the members of the attribute data class A1 ... An. These hard-wired bit patterns coupled to each latch are on a plurality of buses symbolized by the line 294. Of course, if serial format input to the latches 292, 293 etc. is desired each of the attribute data class members must be shifted into the corresponding latch by circuitry which will be apparent to those skilled in the art. The preferred data handling architecture is parallel load latches and parallel format buses 289 and 294.

After loading, latch 292 stores a concatenation of the D' and P' bits with the A1 attribute data member, while latch 293 stores a concatenation of the D' and P' bits with the A2 member of the attribute data class.

The output of each latch 292, 293 etc. is bifurcated. The D' and attribute data bits A are supplied to the input of an encoder such as the encoder 295 or the encoder 296 etc. which is dedicated to that particular latch. Thus, the latch 292 has the A1 bits and the D' bits connected to the input of the encoder 295. This encoder calculates the P1" attribute error check bits using the same error correction code and the same alpha operator as were used on the transmitter side to generate the modified attribute error check bits P.

In other embodiments, the encoder 295 (and all the other encoders such as 296 etc.) may use any mathematical and/or logical operation regardless of whether the operation or operations are identical in function or sequence as were used by the encoder or encoders on the transmitter side so long as one condition exists. That condition is that whatever encoding operation chosen for implementation by the receiver side encoders must generate P" equal to P' for D=D' and A=Ax.

Each encoder has its output coupled via a bus to an identity detection circuit such as the identity operator circuits 300, 302 etc.. Each said identity circuit functions to receive the P' and P" bit strings and to determine if they are equal. In the preferred embodiment, the identity detect circuit is an exclusive-or circuit which calculates the syndrome of that particular member of the attribute data class by performing the operation P" X-OR P'. In other embodiments, the identity detect circuit may be any circuitry which detect when P" equals p.

As for latch 292, the latch 293 has its A2 bit outputs and its D' outputs coupled to the input of an encoder 296. The encoder 296 calculates the P2" error check bits. The output of the encoder 296 is coupled to an identity detect exclusive-or circuit 302 which has its other input coupled to the P' bits either from the latch 292 or the latch 293. It does not matter from which source the P' bits come, since all latches from the receiver side store an identical copy of these P' bits. The exclusive-or circuit generates syndrome S2 on its output bus 304. Each exclusive-or circuit 300, 302 etc. generates the syndrome bits either in parallel or serial format and outputs them on one of the buses 303, 304 etc. Each of these syndrome carrying output buses such as buses 303 and 304 is connected to the inputs of a zero detect circuit. These zero detect circuits are implemented with NOR gates in the embodiment of FIG. 6A. The output bus 304 syndrome bits are connected to the inputs of a NOR gate 306, which serves the purpose of determining whether each bit of the syndrome S2 is a logic zero. Another NOR gate 308 serves the same purpose for zero detection of the S1 syndrome.

There will be one latch such as the latches 292 and 293 for each member of the attribute data class. The same is true for the encoders such as the encoders 295 and 296 and for the identity detect circuits such as the circuits 300 and 302. There will also be one NOR gate for each member of the attribute data class.

The output from the NOR gates such as the gates 306 and 308 are collected into a select signal bus 310 which is coupled to the select input of a multiplexer 312 serving as the output circuit. This multiplexer will output the member of the attribute data class which corresponds to the syndrome which was all zero bits. Each input of the multiplexer 312 is hard-wired to the particular bit pattern of a selected one of the attribute data class members. The bit pattern on the select bus 310 determines which of these input ports is connected to the output bus 314.

Figure 6B:
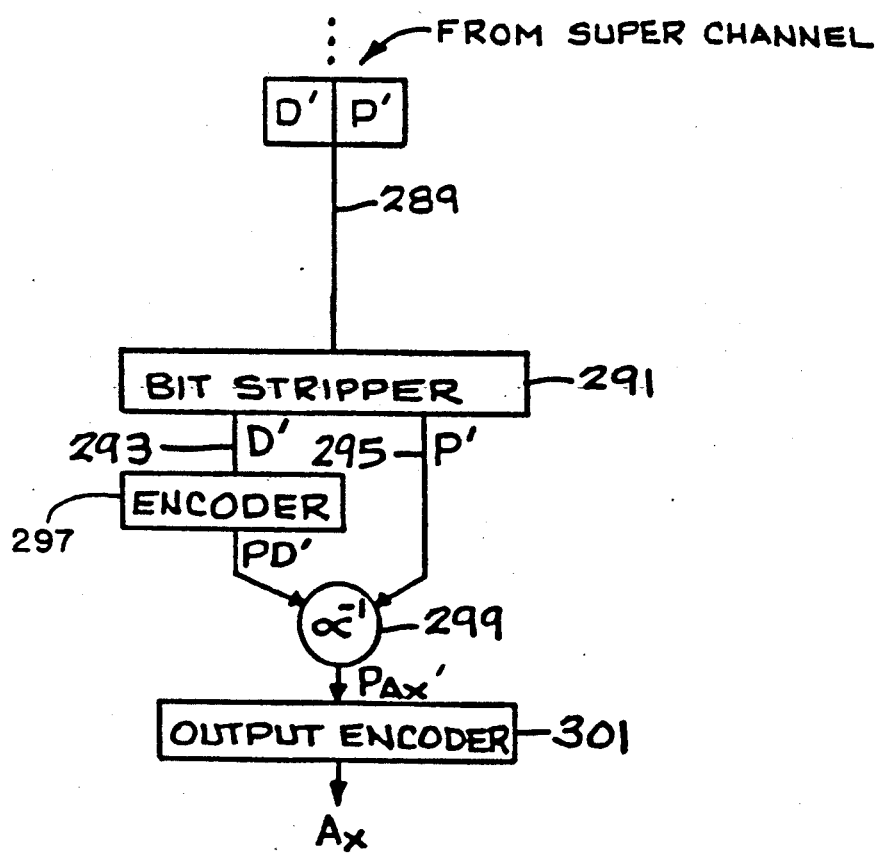
FIG. 6B is a conceptual flow diagram of the changes to the embodiment of FIG. 6A on the receiver side where the alpha operator is selected such that the inverse alpha operator is defined and unique.

Referring to FIG. 6B, there is shown an embodiment of the direct method where the inverse alpha operator is defined. In this embodiment, the input bit string D' and P' on bus 289 from the super channel are applied to a bit stripper 291 which outputs D' on a bus 293 and P' on a bus 295. An encoder 297 receives the D' bits and generates the attribute error check bits Pd' using the same error correction code used on the transmitter side. The Pd' and P' bits are then applied to an inverse alpha operator circuit 299 which generates the Pax bits. The Pax bits are applied to an output circuit 301 which outputs the attribute data corresponding to the Pax bits.

Figure 8A:
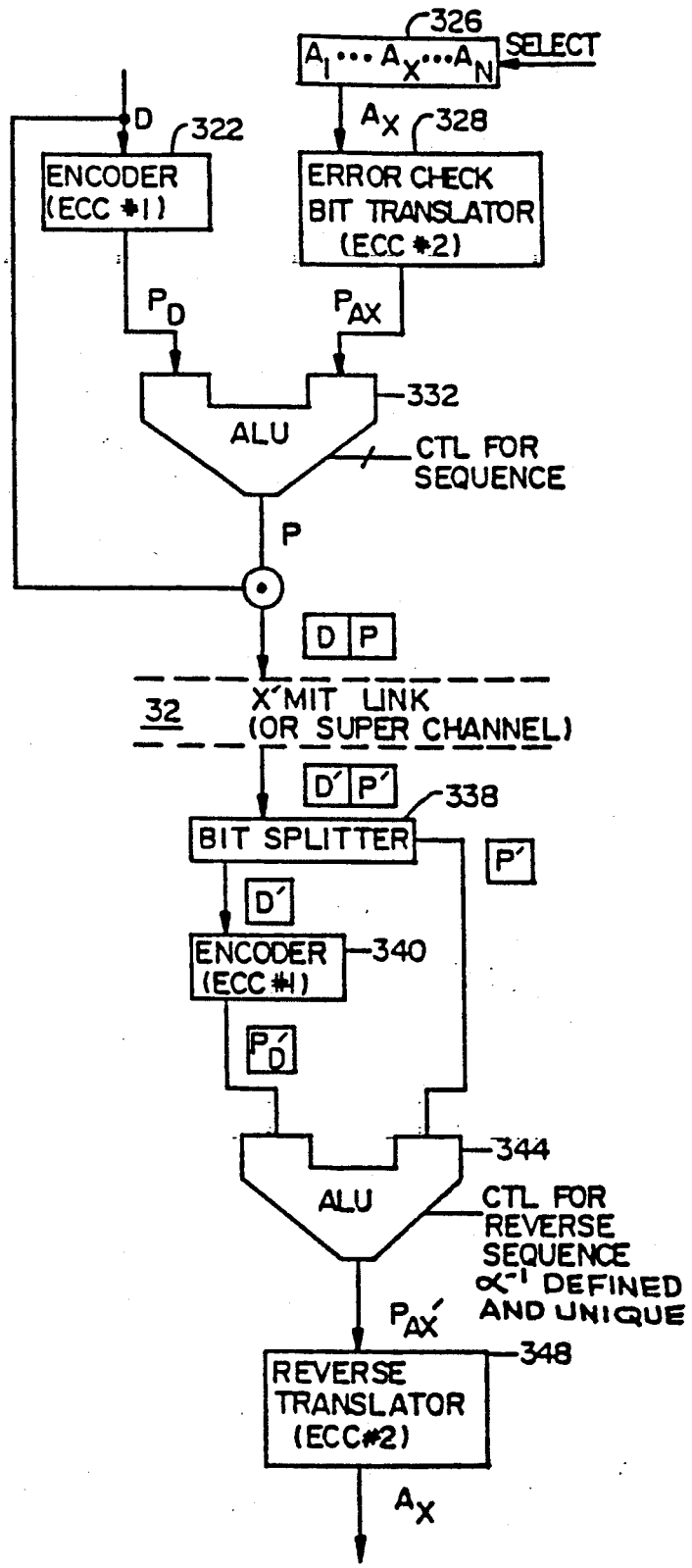
FIG. 8A is a general apparatus for carrying out the method of FIG. 7A.

Referring to FIG. 7A there is shown a flow chart of a general method for practicing the invention using an alpha operator where the inverse alpha operator is defined and unique. FIG. 8A shows a general apparatus for carrying out the method of FIG. 7A.

In FIG. 7A the first step is to calculate Pd using any error correction code, which will hereafter be referred to as ECC #1 as symbolized by step 320. This is accomplished by encoder 322 in FIG. 8A. Step 324 is to generate Pax, the attribute error check bits for the selected attribute data Ax. This is done by circuits 326 and 328 in FIG. 8A. The error correction code implemented by the translator 328 may be a different error correction code, i.e., ECC #2, than was implemented by encoder 322. Typically, 328 is a look-up table or multiplexer for a small class of attribute data.

Step 330 is the encoding step wherein Pax is encoded into Pd using any alpha operator. This operation is performed by ALU 332 or some other logic programmed or controlled to carry out the desired sequence of mathematical and/or logical operations. The particular sequence is not critical nor are the number of mathematical and/or logical operations critical as long as the sequence may be reversed using only P' and Pd' on the receiver side to calculate Pax. In other words, the alpha operator can be any alpha operator, but if the inverse alpha operator is not defined or not unique, trial and error methods will be necessary on the receiver side to derive the identity of the encoded attribute data. Such a general method is depicted in FIG. 7B. If the inverse alpha operator is defined and unique, then the receiver circuitry can directly deduce Pax from Pd' and P' so the identity of Ax can be determined with no trial and error iterations.

Step 334 represents the step of transmitting the D and p bit strings over the transmit link 32 which as in all the above described embodiments, may be a super channel have its own error correction and detection capability.

Step 336 is the calculation of Pd' from the received main data D' using ECC #1. This is accomplished in conventional manner by circuits 338 and 340 in FIG. 8A. The encoder 340 must implement the same error correction code ECC #1 used on the transmitter side. Finally, the alpha sequence of mathmatical and/or logical operations done in step 330 is reversed in step 342, i.e., the inverse alpha operator is performed between Pd and P' to derive Pax. This is done using the calculated Pd' and received error check bits P'. The ALU 344 or some other logic performs this inverse alpha sequence of operations to deduce the Pax bit string.

The last step in embodiments where inverse alpha is defined and unique is 346 to output the Ax corresponding the Pax mathematically deduced in step 342. This is done by reverse translator 348 in FIG. 8A. This translator uses ECC #2, and typically is a look-up table or MUX.

Figure 8B:
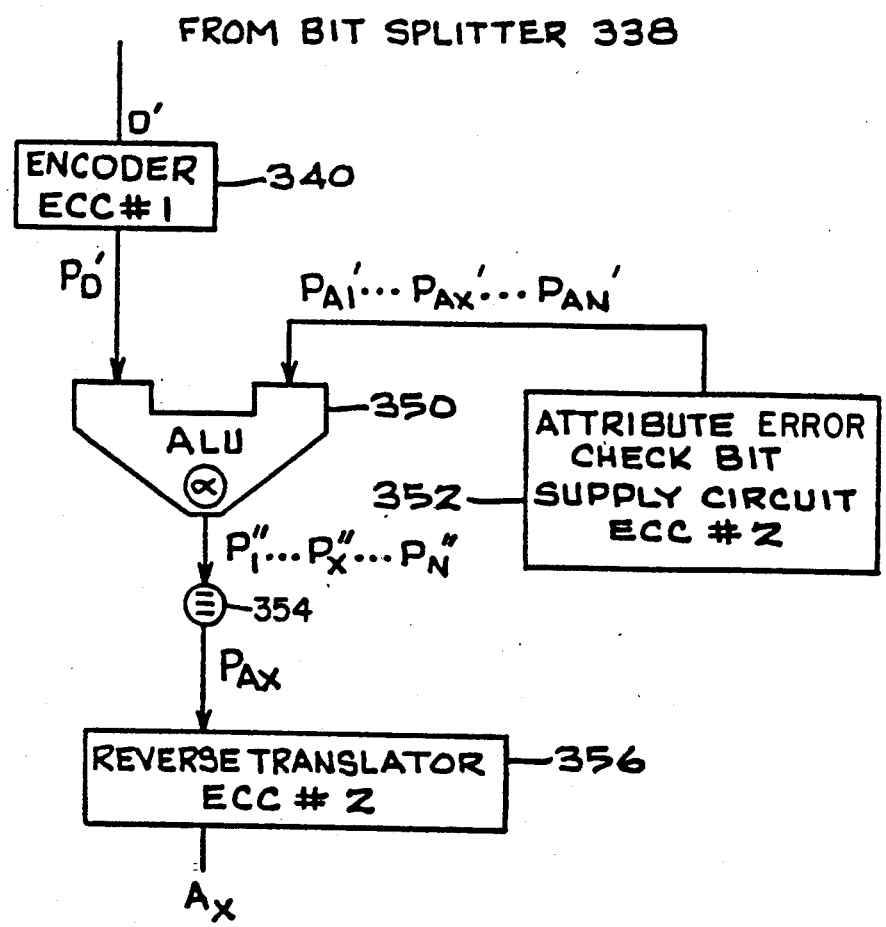
FIG. 8B is a general apparatus for carrying out the method of FIG. 7B.

FIG. 7B shows the changes in the general method of FIG. 7A where the inverse alpha operator is not defined or not unique. FIG. 8B shows a general hardware implementation of the method of FIG. 7B. After step 336, a data evaluation step 337 is performed to encode Pd' and each of the attribute error check bits Pa1 . . . Pax . . . Pan for the members of the attribute data class. This is done using the same alpha operator as was used in the transmitter side to encode Pax into Pd to derive P. In FIG. 8B, this is performed by the ALU 350 which has the Pd' field as one input and the Pa1 . . . Pan fields sequentially arriving at the other input from an attribute data check bit supply circuit 352 such as a look up table or an encoder using ECC #2. As each member of the class Pa1 . . . Pan arrives at the ALU input, the ALU 350 is controlled to perform the alpha operator sequence of mathmatical and/or logical operations between the two input data fields so as to output a presyndrome P1", P2" . . . Pn". One such presyndrome is output for every member of t he attribute data class (or at least all members of the attribute data class in the ambiguity subset). Step 337 of FIG. 7B therefore results in a plurality of presyndromes P1" . . . Px" . . . Pn" where Px" corresponds to the Pax error check bits for the selected member of the attribute data class. Next, step 339 is performed to test each of the P1" . . . Px" . . . Pn" presyndromes against P' for identity. In FIG. 8B this is performed by the identity test circuit 354. Only Px" will result in an identity determination, and this data is passed to step 341 which outputs the member of the attribute data class corresponding to the partial syndrome Px". In FIG. 8B, step 341 is implemented by the reverse translator 356 which is either a look up table or some decoder which embodies ECC #2 to convert Pax to the corresponding Ax.

Although the invention has been described in terms of the preferred embodiment and alternative embodiments discussed herein, it will be apparent to those skilled in the art that numerous modifications are possible without departing from the true spirit and scope of the invention. All such modifications are intended to be included within the scope of the claims appended hereto.

What is claimed is:

1. An apparatus for encoding attribute data into error check symbols of main data and for decoding said attribute data so encoded from the main data and error check symbols after transmission of same, said attribute data defined by a class of attribute data members, said apparatus comprising:

first means coupled to receive said main data and attribute data members, for generating first main data error check symbols for said main data, and for encoding said first main data error check symbols with an attribute data member to create modified error check symbols; and second means coupled to receive said main data and said modified error check symbols from said first means and for supplying a copy of the attribute data for each member in the class of attribute data members, and for generating second main data error check symbols from said received main data, and for decoding said received modified error check symbols and said second main data error check symbols and said copies of the attribute data for each individual member of said class of attribute data members to ascertain the identify of the selected one of the class of attribute data members which was encoded into said first main data error check symbols to create said modified error check symbols.

2. An apparatus for encoding attribute data into error check symbols of main data and for decoding said attribute data so encoded from the main data and error check symbols after transmission, said attribute data selected from a class of attribute data members, comprising:

first means coupled to receive said main data and a selected member of said class of attribute data members, for generating first main data error check symbols from said main data and attribute error check symbols from said selected member of said class of attribute data members, and for encoding said attribute error check symbols into said first main data error check symbols according to a predetermined sequence of at least one mathematical and/or logical operation to generate modified error check symbols, and for transmitting said main data and said modified error check symbols;

second means coupled to receive said main data and said modified error check symbols, for generating second main data error check symbols from said received main data and for generating a set of attribute error check symbols for each member of said class of attribute data members, and for encoding each set of attribute error check symbols with said second main data error check symbols using the same predetermined sequence of mathematical and/or logical operations used to generate said modified error check symbols to generate a plurality of presyndromes, and for performing a symbol for symbol comparison between each said presyndrome and said received modified error check symbols to generate a plurality of syndromes, and for outputting the member of said class of attribute data which corresponds to the set of attribute error check symbols which generated a presyndrome which matched said received modified error check symbols on a symbol for symbol basis.

3. The apparatus of claim 2 wherein said second means includes an identity detect means coupled to receive said syndromes for examining said syndromes to determine the identity of said selected member of said class of attribute data members.

4. The apparatus of claim 3 wherein said second means includes output means coupled to said identity detect means for outputting the selected member of said class of attribute data members corresponding to the syndrome identified by said identity detect means.

5. The apparatus of claim 4 wherein said identity detect means is a zero detection circuit and wherein the syndrome which identifies the selected member of said class of attribute data members is all zeros, and wherein said second means further comprises a plurality of zero detect logic means, each coupled to receive one said syndrome, and each for generating a control signal indicating if its particular syndrome is all zeros, and wherein said output means is coupled to each said control signal from each said zero detect logic means, said output means outputting the attribute data member corresponding to the one syndrome which is all zeros.

6. The apparatus of claim 2 wherein said second means includes attribute error check symbol supply means for supplying a set of attribute error check symbols corresponding to each member in said class of attribute data members simultaneously on a plurality of output buses, and wherein said second means includes a plurality of exclusive-or logic means, each having one input coupled to one of said output buses and another input coupled to receive said received modified error check symbols, each for performing a symbol for symbol exclusive-or logical operation between said received modified error check symbols and the set of said attribute error check symbols corresponding to one member of the class of attribute data members to generate a syndrome where said syndrome corresponds to a member of said class of attribute data members.

7. An apparatus for encoding attribute data into error check symbols of main data to generate modified error check symbols and for decoding said attribute data so encoded from the main data and modified error check symbols after transmission of same, said attribute data defined by a class of selected attribute data members, said apparatus comprising:

first encoding means for encoding a selected member of said attribute data class into the error check symbols of said main data to generate modified error check symbols;

first decoding means coupled to receive said main data and said modified error check symbols for decoding same to derive the identity of the selected member of said class of attribute data members encoded in said modified error check symbols.

8. The apparatus of claim 7 wherein said selected member of said attribute data class is encoded by said first encoding means according to an encoding algorithm, and said first decoding means comprises:

attribute data supply means for supplying each of said members of said class of attribute data members and for concatenating each member of said attribute data class with said received main data to form a plurality of fields of data;

second encoding means for translating each said field of said plurality of fields of data into a corresponding presyndrome for each of said plurality of fields of data, each said presyndrome comprising a group of check symbols, said translation being performed according to said encoding algorithm used to encode said selected member of attribute data into said error check symbols of said main data; and syndrome generation means coupled to receive each said presyndrome and said modified error check symbols, for performing a symbol for symbol identity check between said presyndrome and said modified error check symbols to ascertain which of said presyndromes is identical to said modified error check symbols.

9. The apparatus of claim 8 wherein said first encoding means encodes a selected member of said attribute data class according to an error correction code, and wherein said attribute data supply means supplies all members of said class of attribute data members simultaneously on a plurality of different buses with each bus carrying one member of said attribute data class, and wherein said second encoding means includes a plurality of error check symbol calculation circuits each of which is coupled to receive a field of data comprised of the received main data concatenated with the attribute data member on one of said buses, each said error check symbol calculation circuit for generating one said presyndrome by translating the received field of data according to said error correction code used by said first encoding means, and wherein said syndrome generation means includes a plurality of exclusive-or logic gates, each coupled to receive the received modified error check symbols at a first input and one of said presyndromes at a second input, for performing a symbol for symbol exclusive-or logical operation therebetween to simultaneously generate a plurality of syndromes, where each said syndrome corresponds to one member of said attribute data class.

10. The apparatus of claim 7 wherein said first encoding means includes means for generating said modified error check symbols by encoding the selected member of said class of attribute data into main data error check symbols according to a sequence of at least one logical and/or mathematical operation, said sequence having a defined and unique inverse sequence of at least one logical and/or mathematical operation, and wherein said first decoding means includes means for generating second main data error check symbols from the main data received from said first encoding means, said second main data error check symbols being generated according to said code used in said first encoding means to generate first main data error check symbols from said main data, and further includes means for applying said inverse sequence to said second main data error check symbols and said received modified error check symbols thereby calculating the identity of the selected member of said attribute data class which was encoded into said modified error check symbols by said first encoding means.

11. An apparatus for encoding attribute data into the error check symbols of main data and for decoding said attribute data so encoded from the main data and error check symbols after transmission of same without transmission of said attribute data, said attribute data defined by a class of selected attribute data members, said apparatus comprising:

first means for generating first main data error check symbols for said main data and for encoding said first main data error check symbols with attribute error check symbols corresponding to a selected member of said class of attribute data members to generate modified error check symbols; and second means for decoding said modified error check symbols and said main data and the attribute error check symbols corresponding to each member of said class of attribute data members to ascertain the identity of the selected member from said class of attribute data members which was encoded by said first means into the first main data error check symbols; and data transmission means for coupling said first means to said second means for transmitting said main data and said modified error check symbols between said first means and said second means, said data transmission means including means for independently generating separate error check symbols on said main data and said modified error check symbols and for transmitting said main data, said modified error check symbols and said separate error check symbols, said data transmission means further including means for receiving said main data, said modified error check symbols and said separate error check symbols and for using said separate error check symbols to detect and correct errors in said main data and said modified error check symbols which occurred during transmission and for delivering the corrected main data and modified error check symbols to said second means.

12. An apparatus for encoding a selected member of a class of first data members in error check symbols of second data and for recovery of said selected member of said class of first data members after transmission of said second data and said error check symbols without actual transmission of said selected member comprising:

first means for receiving said selected member of said class of first data members and said second data for generating error check symbols for said selected member of said class of first data members and for generating error check symbols for said second data and generating modified error check symbols using a predetermined sequence of mathematical and/or logical operations which has a defined and unique inverse sequence of mathematical and/or logical operations between said error check symbols of said selected member and said error check symbols of said second data;

data transmission means for transmitting said second data and said modified error check symbols; and second means for receiving said modified error check symbols and said second data from said data transmission means, for separately generating error check symbols for said second data, and for calculating the identity of said selected member of said class of first data members by performing said inverse sequence of mathematical and/or logical operations between said error check symbols for said second data and said received modified error check symbols.

13. The apparatus of claim 12 further comprising means coupled to said second means for identifying the member of the class of first data members by evaluation of data calculated by said second means and for outputting said selected member of the class of first data members.

14. A method of transmitting information regarding selected attribute data from a known class of said attribute data with main data and error check symbols associated with said main data without actually transmitting said selected attribute data, comprising the steps of:

encoding first main data error check symbols generated from said main data with information identifying said selected attribute data to generate modified error check symbols;

transmitting said main data and said modified error check symbols;

receiving said main data and said modified error check symbols and processing the received main data and the received modified error check symbols to generate the selected attribute data.

15. A method of transmitting main data and associated error check symbols with the identity of selected attribute data encoded therein, said attribute data coming from a class of a plurality of different attribute data comprising the steps of:

concatenating said selected attribute data with said main data;

generating modified error check symbols from the concatenated string of attribute data and main data according to an error correction code;

transmitting said main data and said modified error check symbols;

receiving said main data and said modified error check symbols;

concatenating each member of said class of attribute data with said received main data to generate a plurality of data strings;

generating a plurality of presyndromes from said plurality of data strings using said error correction code; and generating a syndrome for each said presyndrome by performing an equality check between each said presyndrome symbols and the received modified error check symbols to identify the selected attribute data.

16. A method of transmitting data representing a selected member of a class of attributes data members by encoding the selected member into error check symbols generated from main data, comprising the steps of:

calculating first main data error check symbols for said main data according to an error correction code;

encoding said first main data error check symbols with a selected member of said attribute data class according to a predetermined operation which has an inverse logic operation which is defined and unique to generate modified error check symbols;

transmitting said main data and said modified error check symbols;

receiving said main data and said modified error check symbols;

generating second main data error check symbols from said received main data using said error correction code;

calculating said selected member of said class of attribute data members which was encoded into said modified error check symbols by reversing said predetermined operation between said modified error check symbols and said second main data error check symbols.

17. A method of transmitting data representing a selected member of a class of known attribute members by encoding said selected member into error check symbols generated for main data comprising the steps of:

calculating first error check symbols for said main data according to a linear error correction code;

generating second error check symbols from said selected member of the attribute member class according to a linear error correction code;

encoding said first error check symbols with said second error check symbols by performing a predetermined sequence of one or more mathematical and/or logical operations between said first and second error check symbols to generate modified error check symbols where said sequence has a defined and unique inverse sequence of mathematical and/or logical operations;

transmitting and receiving said main data and said modified error check symbols;

calculating said second error check symbols for said selected member of said attribute member class from said received main data and said received modified error check symbols by applying said inverse sequence of mathematical and/or logical operations performed in said encoding step and outputting said selected member of said attribute member class corresponding to said second error check symbols so calculated.

18. The method of claim 17 wherein said sequence of mathematical and/or logical operations in said encoding step is binary addition of said first and said second error check symbols and wherein said calculating step of reversing said sequence of mathematical and/or logical operations comprises generation of third error check symbols from said received main data according to said linear error correction code of said encoding step followed by binary subtraction performed between said third error check symbols and said received modified error check symbols.

19. A method of encoding selected attribute data from a class of different attribute data members into error check bits of main data and for transmitting said main data and said error check bits and for recovering said selected attribute data from the transmitted main data and encoded error check bits for said main data without transmitting said attribute data, comprising the steps of:

generating first main data error check bits for said main data according to a first linear error correction code;

modifying the first main data error check bits with attribute error check bits derived from said selected member of the class of said attribute data members according to a second linear error correction code which may or may not be identical to said first linear error correction code by performing the exclusive-or logic operation between said first main data error check bits and said attribute error check bits to generate modified error check bits;

transmitting said modified error check bits and said main data;

receiving said main data and said modified error check bits;

generating second main data error check bits from said received main data according to said first linear error correction code;

generating a partial syndrome by performing a bit for bit exclusive-or logic operation between said second main data error check bits and said received modified error check bits;

generating a plurality of syndromes by supplying a set of attribute error check bits for each member of the class of attribute data members and performing a bit for bit exclusive-or logical operation between each said set of said attribute error check bits and said partial syndrome;

identifying the syndrome in said plurality of syndromes which is all zeros and corresponds to said selected member of said attribute data class; and outputting said selected attribute data member corresponding to said all zero syndrome.

20. A method of transmitting information regarding selected attribute data member from a class of attribute data members by encoding said selected attribute data member into error check symbols generated for main data, comprising the steps of:

calculating modified error check symbols for said main data concatenated with the selected attribute data member with said selected attribute data member concatenated in the most significant bit positions using a linear error correction code;

transmitting and receiving said main data and said modified error check symbols;

calculating a plurality of sets of second error check symbols from a plurality of bit strings where each bit string is comprised of said received main data concatenated with one member of said class of attribute data members in the most significant bit positions according to said linear error correction code; and generating a plurality of syndromes by performing an exclusive-or logic operation between each of said sets of said second error check symbols and the received modified error check symbols; and outputting the selected member of said class of attribute data members corresponding to the syndrome which is all zeros.

21. An apparatus for encoding selected attribute data into error check symbols of main data and for decoding said attribute data so encoded from the main data and error check symbols after transmission of same, said attribute data included within a class of attribute data members, said apparatus comprising:

first means coupled to receive said main data and attribute data members, for generating first main data error check symbols for said main data and for encoding said first main data error check symbols with said selected attribute data to create modified error check symbols; and second means coupled to receive said main data and said modified error check symbols from said first means, for generating second main data error check symbols from the received main data and for decoding the received modified error check symbols and said second main data error check symbols to ascertain the identity of said selected attribute data.

* * * * *